United States Patent
Son et al.

(10) Patent No.: US 11,637,115 B2
(45) Date of Patent: Apr. 25, 2023

(54) VERTICAL NON-VOLATILE MEMORY DEVICE

(71) Applicant: SAMSUNG ELECTRONICS CO., LTD., Suwon-si (KR)

(72) Inventors: Younghwan Son, Hwaseong-si (KR); Boyoung Lee, Hwaseong-si (KR); Seoungwon Lee, Hwaseong-si (KR); Seunghwan Lee, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 251 days.

(21) Appl. No.: 16/893,524

(22) Filed: Jun. 5, 2020

(65) Prior Publication Data
US 2021/0098479 A1    Apr. 1, 2021

(30) Foreign Application Priority Data

Sep. 27, 2019    (KR) ........................ 10-2019-0119821

(51) Int. Cl.
*H01L 27/11556*    (2017.01)
*G11C 5/06*    (2006.01)
*H01L 27/11582*    (2017.01)

(52) U.S. Cl.
CPC .......... *H01L 27/11556* (2013.01); *G11C 5/06* (2013.01); *H01L 27/11582* (2013.01)

(58) Field of Classification Search
CPC ......... H01L 27/11556; H01L 27/11582; H01L 29/40117; H01L 27/11563; H01L 27/11568; H01L 29/66833; H01L 29/792; H01L 27/11273–1128; H01L 27/11551; H01L 27/11578; H01L 27/11597; H01L 27/2481; H01L 27/249; G11C 5/06
See application file for complete search history.

(56) References Cited

U.S. PATENT DOCUMENTS

| | | | |
|---|---|---|---|
| 8,193,571 B2 | 6/2012 | Katsumata et al. | |
| 8,373,222 B2 | 2/2013 | Sekine et al. | |
| 8,564,050 B2 | 10/2013 | Park et al. | |
| 9,082,658 B2 | 7/2015 | Lee | |
| 9,166,032 B1 * | 10/2015 | Higuchi | H01L 27/11582 |
| 9,666,449 B2 | 5/2017 | Koval | |
| 9,966,451 B1 | 5/2018 | Lee | |
| 10,103,163 B2 | 10/2018 | Son et al. | |
| 2016/0293623 A1 | 10/2016 | Simsek-Ege et al. | |

* cited by examiner

*Primary Examiner* — Cuong B Nguyen
(74) *Attorney, Agent, or Firm* — Lee IP Law, P.C.

(57) ABSTRACT

A vertical non-volatile memory device includes a stack body including gate patterns and interlayer insulating patterns stacked in a stacking direction, the stack body having a through hole, which extends in the stacking direction, in the gate patterns and in the interlayer insulating patterns; a semiconductor pillar in the through hole and extending in the stacking direction; data storage structures between the gate patterns and the semiconductor pillar in the through hole, the data storage structures including charge storage layers; and dummy charge storage layers on a sidewall of the interlayer insulating patterns toward the semiconductor pillar in the through hole.

19 Claims, 35 Drawing Sheets

VERTICAL NON-VOLATILE MEMORY DEVICE

CROSS-REFERENCE TO RELATED APPLICATION

Korean Patent Application No. 10-2019-0119821, filed on Sep. 27, 2019, in the Korean Intellectual Property Office, and entitled: "Vertical Non-Volatile Memory Device," is incorporated by reference herein in its entirety.

BACKGROUND

1. Field

Embodiments relate to a vertical non-volatile memory device.

2. Description of the Related Art

A non-volatile memory device retains stored data even when power is not supplied thereto. To improve the integration of a non-volatile memory device, cell transistors may be stacked in a vertical direction.

SUMMARY

Embodiments are directed to a vertical non-volatile memory device, including a stack body including gate patterns and interlayer insulating patterns stacked in a stacking direction, the stack body having a through hole, which extends in the stacking direction, in the gate patterns and in the interlayer insulating patterns; a semiconductor pillar in the through hole and extending in the stacking direction; data storage structures between the gate patterns and the semiconductor pillar in the through hole, the data storage structures including charge storage layers; and dummy charge storage layers on a sidewall of the interlayer insulating patterns toward the semiconductor pillar in the through hole.

Embodiments are also directed to vertical non-volatile memory device, including a stack body including gate patterns and interlayer insulating patterns that are alternately stacked in a stacking direction, the stack body having a through hole extending in the stacking direction in the gate patterns and the interlayer insulating patterns, the stack body including recess holes communicating with the through hole and recessed from a sidewall of the interlayer insulating patterns in a direction of the gate patterns; data storage structures including blocking insulating layers in contact with the gate patterns in the recess holes, charge storage layers in contact with the blocking insulating layers in the recess holes, and a tunnel insulating layer in contact with the charge storage layers and extending in the stacking direction in the through hole; a semiconductor pillar in contact with the data storage structures and extending in the stacking direction in the through hole and the recess holes; and dummy charge storage layers on a sidewall of the interlayer insulating patterns toward the semiconductor pillar in the through hole.

Embodiments are also directed to vertical non-volatile memory device, including a stack body including gate patterns and interlayer insulating patterns that are alternately stacked, the stack body having a through hole extending in a stacking direction in the gate patterns and the interlayer insulating patterns, the stack body including curved-surface recess holes that are recessed from a sidewall of the interlayer insulating patterns in a direction of the gate patterns, the curved-surface recess holes communicating with the through hole and having a curved surface; curved-surface data storage structures in the curved-surface recess holes, the curved-surface data storage structures including curved-surface blocking insulating layers in contact with the gate patterns, curved-surface charge storage layers in contact with the curved-surface blocking insulating layers, and a curved-surface tunnel insulating layer in contact with the curved-surface charge storage layers in the curved-type recess holes and extending in the stacking direction in the through hole; isolated insulating layers in the stacking direction in the curved-surface recess holes and the through hole to contact the curved-surface charge storage layers; dummy charge storage layers on a sidewall of the interlayer insulating patterns in the through hole and the curved-surface recess holes, the dummy charge storage layers being separated by the isolated insulating layers; and a curved-surface semiconductor pillar being on a sidewall of the curved-surface tunnel insulating layer and a side of the dummy charge storage layers and extending in the stacking direction in the through hole.

BRIEF DESCRIPTION OF THE DRAWINGS

Features will become apparent to those of skill in the art by describing in detail example embodiments with reference to the attached drawings in which.

DETAILED DESCRIPTION

Hereinafter, a vertical non-volatile memory device will be described taking a negative AND (NAND) flash memory device as an example.

Figure 1:
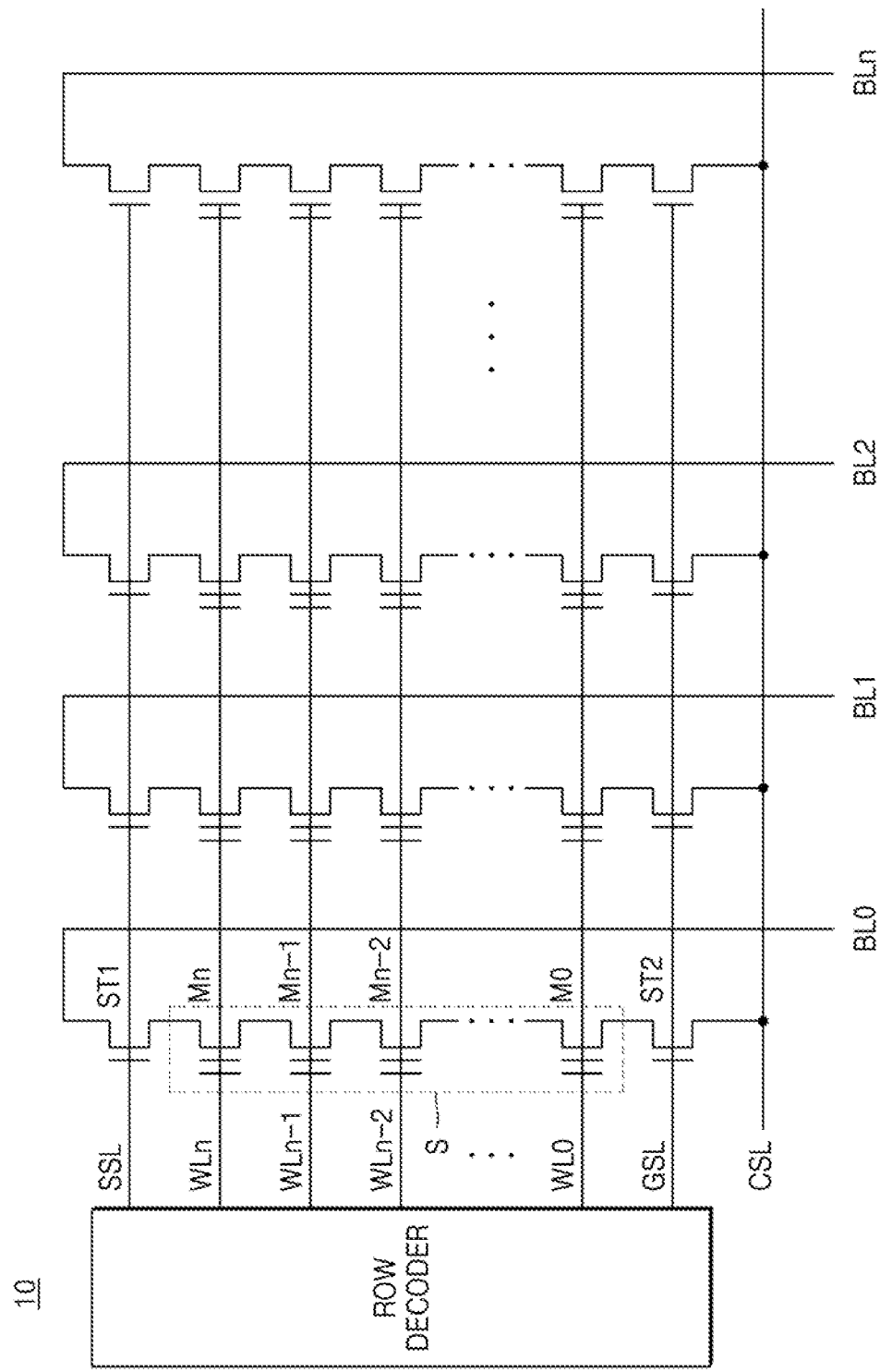
FIGS. 1 and 2 illustrate circuit diagrams of a vertical non-volatile memory device according to an example embodiment.
Figure 2:
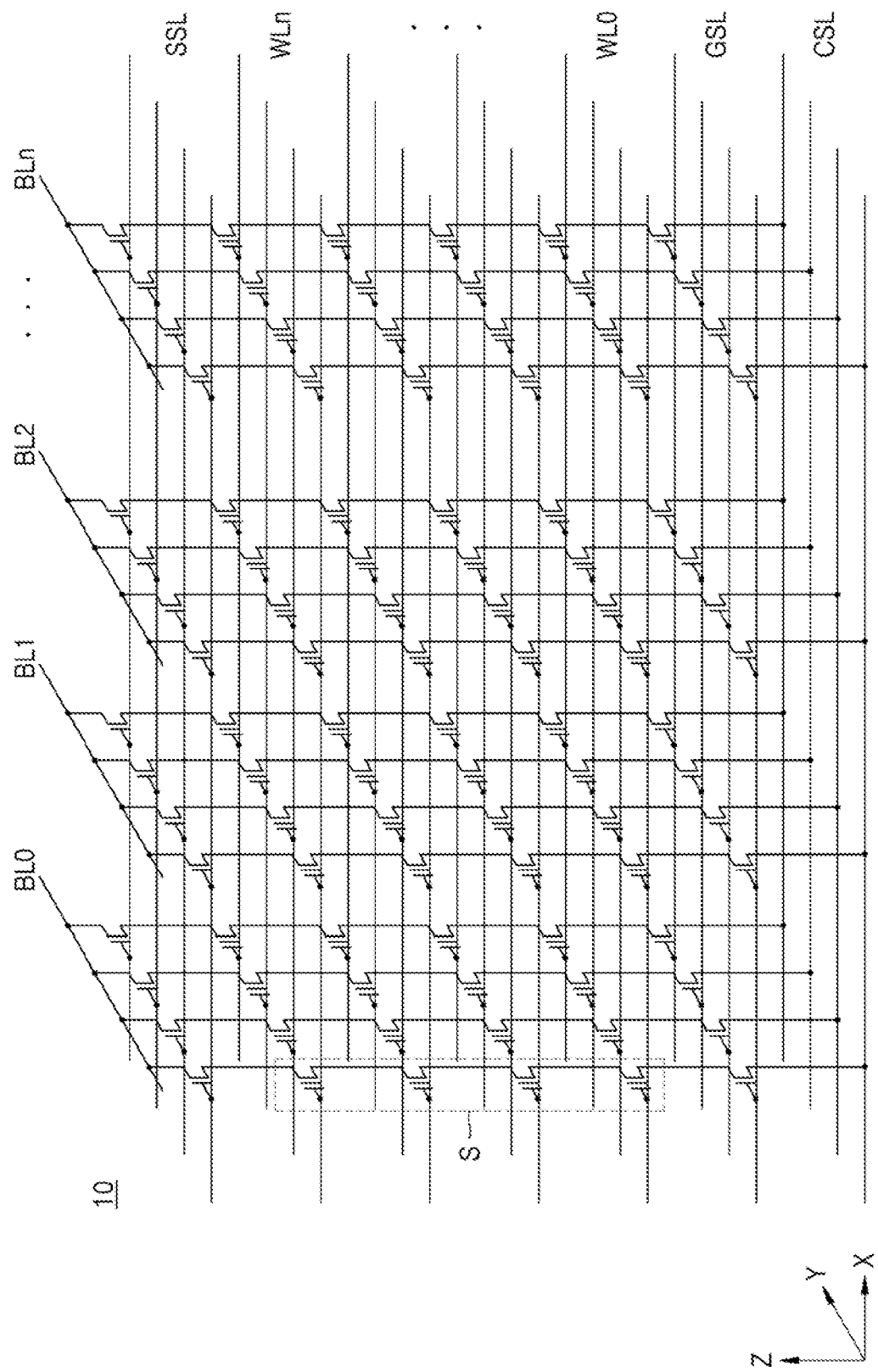

FIGS. 1 and 2 are circuit diagrams of a vertical non-volatile memory device 10 according to an example embodiment.

FIGS. 1 and 2 are respectively two-dimensional and three-dimensional circuit diagrams of the vertical non-volatile memory device 10, that is, a NAND flash memory device.

In the vertical non-volatile memory device 10, N cell transistors M0 through Mn (M0~Mn) are serially connected to construct a cell string S. Multiple cell strings S are connected in parallel between bit lines BL0 through BLn (BL0~BLn) and a ground selecting line GSL.

In the present example embodiment, the vertical non-volatile memory device 10 includes the cell string S, in which the cell transistors M0~Mn are serially connected, word lines WL0 through WLn (WL0~WLn) used for selecting the cell transistors M0~Mn, and a row decoder configured to drive the word lines WL0~WLn.

In the present example embodiment, the vertical non-volatile memory device 10 includes: a string selecting line SSL connected to one side of the cell string S and including a string selecting transistor ST1; the bit lines BL0~BLn connected to a drain of the string selecting transistor ST1; and the ground selecting line GSL connected to another side of the cell string S and including a ground selecting transistor ST2. In addition, in the vertical non-volatile memory device 10, a common source line SL is connected to a source of the ground selecting transistor ST2.

The vertical non-volatile memory device 10 may construct a unit string that includes the cell string S, and the string selecting transistor ST1 and the ground selecting transistor ST2 respectively connected to an upper portion and a lower portion of the cell string S. Although FIGS. 1 and 2 show that one string selecting transistor ST1 and one ground selecting transistor ST2 are connected to the cell string S to construct the unit string, two or more string selecting transistor ST1 may be formed, and two or more ground selecting transistors ST2 may be formed.

The cell transistors M0~Mn may include 2 m cell transistors (where m is a natural number equal to or greater than 1) formed in one cell string S. For example, two, four, eight, or sixteen cell transistors M0~Mn may be serially connected to one cell string S. For convenience, only the four of the cell transistors M0~Mn and the four of the word lines WL0~WLn are shown in FIGS. 1 and 2.

In FIG. 2, the X-direction may be a direction in which the word lines WL0~WLn extend, that is, a word line direction. The Y-direction may be a direction in which the bit lines BL0~BLn extend, that is, a bit line direction. The Z-direction may be a direction perpendicular to the word lines WL0~WLn and the bit lines BL0~BLn.

Figure 3:
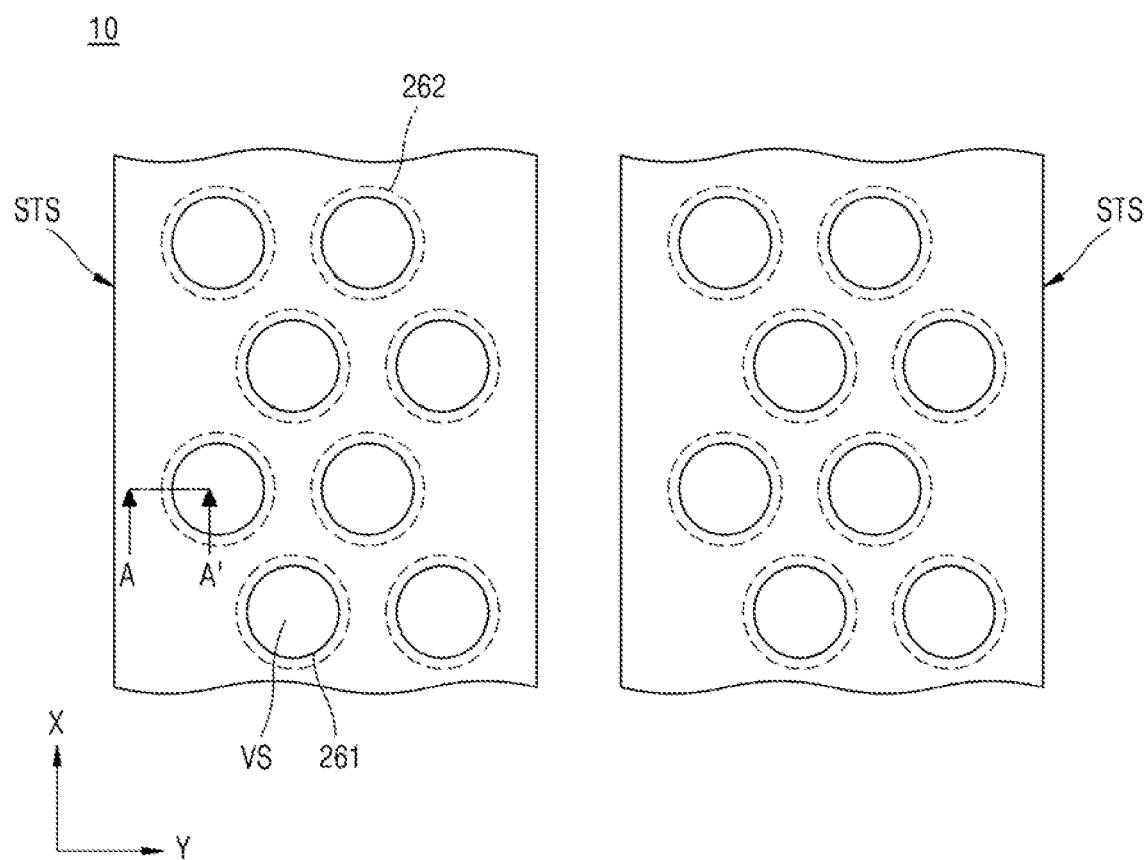
FIG. 3 illustrates a top-plan view of a main portion of a cell transistor in a vertical non-volatile memory device according to an example embodiment.

FIG. 3 is a top-plan view of a main portion of a cell transistor in the vertical non-volatile memory device 10 according to an example embodiment.

The vertical non-volatile memory device 10 may include a plurality of stack bodies STS that are formed above a substrate 202 (see FIG. 4A) and placed apart from one another. The stack body STS may be formed on an X-Y plane. The stack body STS may be formed on a plane formed in the word line direction (X-direction) and the bit line direction (Y-direction).

Through holes 261 located apart from one another may be formed in the stack body STS. The through hole 261 may be a hole penetrating a top surface and a bottom surface of the stack body STS. Recess holes 262 may be formed around the through hole 261 in the stack body STS. The recess holes 262 may be holes recessed into the through hole 261. The recess holes 262 may be holes extending from an inner portion of the through hole 261 toward the stack body STS. The recess holes 262 may communicate with the through hole 261.

A vertical structure VS may be formed in the through hole 261 and the recess holes 262. As described below, a cell transistor of the vertical non-volatile memory device 10 maybe formed in the vertical structure VS. The vertical structure VS may include a semiconductor pillar 274 (see FIG. 4A), data storage structures 288 (see FIG. 4A), dummy charge storage layers 281 (see FIG. 4A), and isolated insulating layers 285 (see FIG. 4A).

Figure 4A:
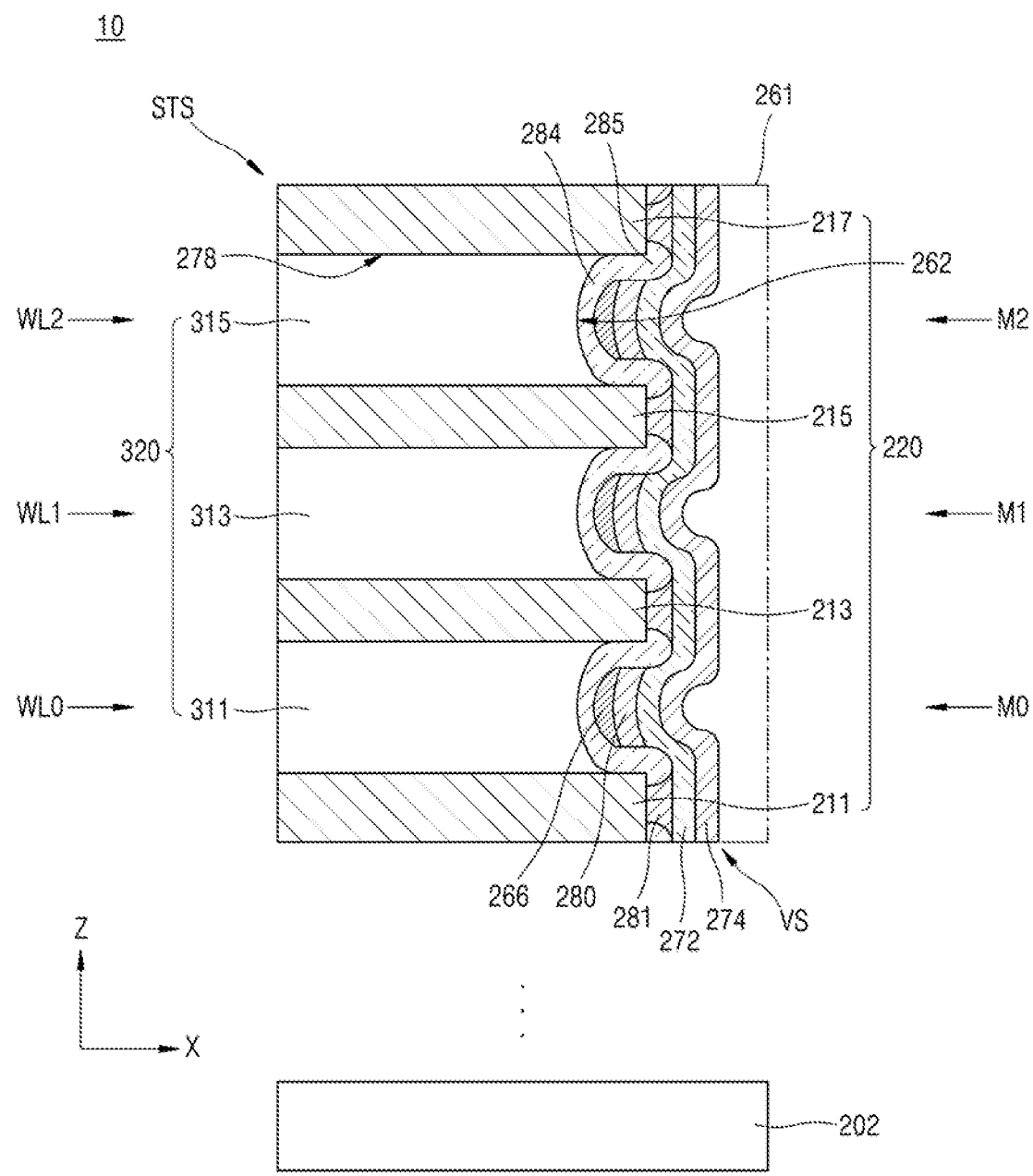
FIG. 4A illustrates a cross-sectional view of the vertical non-volatile memory device shown in FIG. 3 according to an example embodiment, taken along line A-A.
Figure 4B:
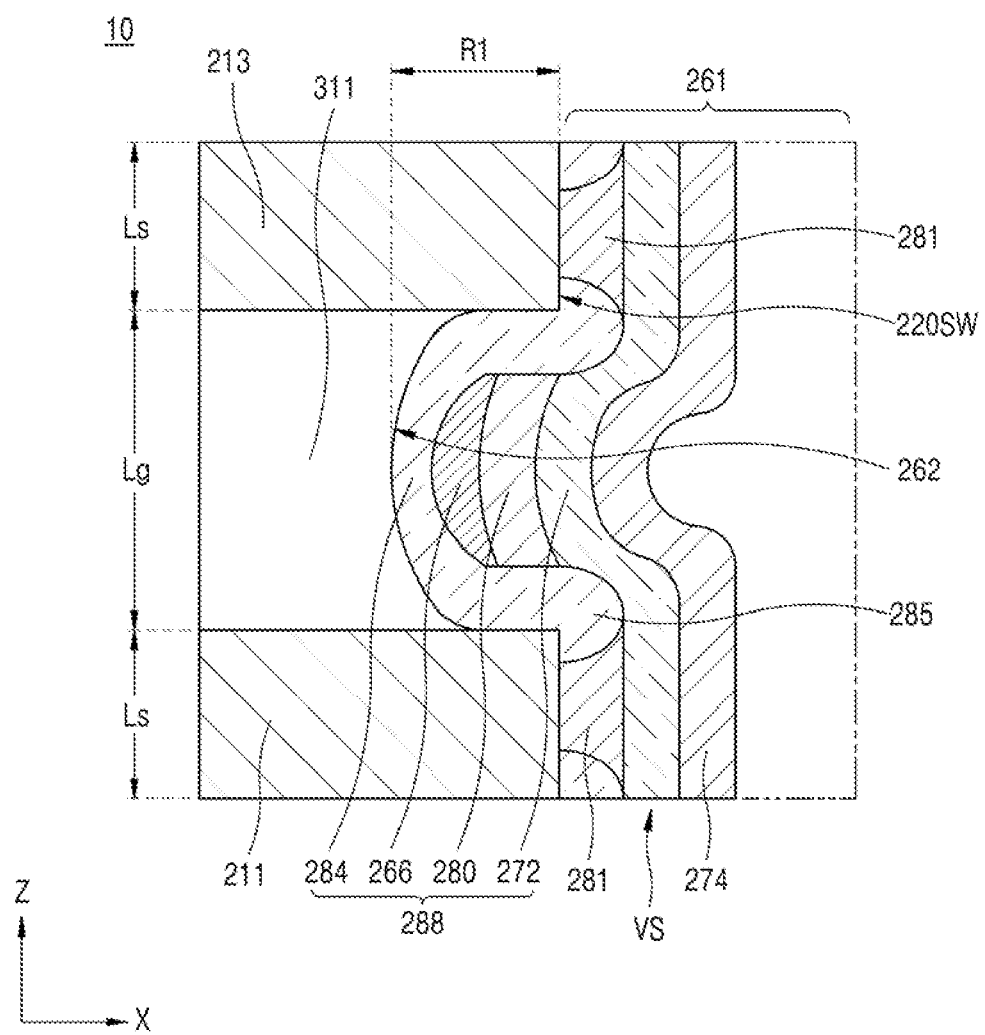
FIG. 4B illustrates an enlarged view of a region of FIG. 4A.

FIG. 4A is a cross-sectional view of the vertical non-volatile memory device 10 shown in FIG. 3 according to an example embodiment, the view being taken along line A-A; and FIG. 4B shows an enlarged view of a region of FIG. 4A.

FIG. 4A illustrates the vertical non-volatile memory device 10 based on only a half of the through hole 261 in FIG. 3. Accordingly, the vertical non-volatile memory device 10 of FIG. 4A may have a bilateral symmetrical structure along the through hole 261. Thus, gate patterns 320 and interlayer insulating patterns 220 may be formed on the right of the through hole 261.

For convenience, the vertical non-volatile memory device 10 of FIG. 4A only shows three word lines WL0, WL1, and WL2 and three cell transistors M0, M1, and M2. The vertical non-volatile memory device 10 of FIG. 4B shows an enlarged image of one word line WL0 and one cell transistor M0. In FIGS. 4A and 4B, the X-direction may be the word line direction, and the Z-direction may be a direction perpendicular to the word line direction.

According to the present example embodiment, the vertical non-volatile memory device 10 includes the stack body STS. The stack body STS may include the gate patterns 320 and the interlayer insulating patterns 220 alternately stacked on the substrate 202. The gate patterns 320 may include first through third gate patterns 311, 313, and 315.

The substrate 202 may include a single-crystal semiconductor material. The substrate 202 may include, for example, a monocrystalline silicon substrate. A monocrystalline silicon substrate may include a monocrystalline silicon wafer, for example, a P-type monocrystalline silicon wafer. An impurity region may be provided to the common source line CSL (see FIGS. 1 and 2), for example, an N-type impurity region, may be formed in the substrate 202.

The interlayer insulating patterns 220 may include first through fourth interlayer insulating patterns 211, 213, 215, and 217. As described below, the gate patterns 320 may be formed in cavities 278 between the first through fourth interlayer insulating patterns 211, 213, 215, and 217. The cavities 278 may be gaps between the first through fourth interlayer insulating patterns 211, 213, 215, and 217.

In FIGS. 4A and 4B, a height Lg of the gate patterns 320, for example, a height Lg of the first gate pattern 311, may indicate a gate length Lg, for example, in the Z or vertical direction. A height Ls of the interlayer insulating patterns 220 may indicate a space length between the gate patterns 320, for example, in the Z or vertical direction.

The stack body STS may include the through hole 261 extending in a stacking direction, that is, the Z-direction, in the gate patterns 320 and the interlayer insulating patterns 220. The stacking direction, that is, the Z-direction, may be a direction in which the gate patterns 320 and the interlayer insulating patterns 220 are stacked.

The stack body STS may include the recess holes 262, which may be recessed by a first depth R1 from a sidewall 220SW of the interlayer insulating patterns 220 toward the gate patterns 320. The recess holes 262 may communicate with the through holes 261. Surfaces of the recess holes 262, the surfaces being in contact with the gate patterns 320, may be curved.

When the recess holes 262 are formed, the data storage structures 288 may be formed or buried in the recess holes 262, and thus, separation between the cell transistors M0, M1, and M2 may be easily performed. In another implementation, the recess holes 262 may not be formed.

The vertical structure VS may be formed in the through hole 261. The vertical structure VS may include a semiconductor pillar 274 extending in the through hole 261 in the stacking direction. The semiconductor pillar 274 may include a semiconductor pattern having a cylinder shape or a pillar shape on the substrate 202. As shown in FIGS. 3 and 4A, the semiconductor pillars 274 may be repeatedly arranged apart from one another in the X direction and Y direction at a regular interval.

The semiconductor pillar 274 may be formed on the substrate 202 to extend in a vertical direction. The semiconductor pillar 274 may include, for example, a monocrystalline silicon layer. The semiconductor pillar 274 may provide an active region of the vertical non-volatile semiconductor memory device. For example, the semiconductor pillar 274 may be used as a channel layer of the cell transistors M0, M1, and M2.

In the through hole 261, the data storage structures 288 may be located between the gate patterns 320 and the semiconductor pillar 274. When the recess holes 262 are formed, the semiconductor pillar 274 may be in contact with the data storage structures 288 and may extend in the stacking direction in the through hole 261 and the recess holes 262.

The data storage structures 288 may include charge storage layers 280. The charge storage layers 280 may include charge trapping layers. The data storage structures 288 may include a tunnel insulating layer 272, the charge storage layers 280, and blocking insulating layers 266 and 284 sequentially formed in a direction of the gate patterns 320 on the semiconductor pillar 274.

The tunnel insulating layer 272 may include a tunnel oxide layer. The tunnel insulating layer 272 may be a thermal oxide film formed by, for example, thermally oxidizing a surface of the semiconductor pillar 274. The tunnel insulating layer 272 may include silicon oxide formed by, for example, a thermal-oxidation process. The tunnel insulating layer 272 may include an oxide formed by, for example, a chemical vapor deposition method.

The charge storage layers 280 may include a silicon nitride or a metal oxide that is capable of trapping charges. In this case, the charges may be stored in the charge storage layers 280 by a charge trapping method. The charge storage layers 280 may include a silicon nitride, which may be deposited in a small thickness.

The blocking insulating layers 266 and 284 may include a silicon oxide or a metal oxide that has a dielectric constant higher than that of the silicon oxide. The cell transistors M0, M1, and M2 may be electrically set on and off by Fowler-Nordheim tunneling (F-N tunneling) or hot electron injection.

In an example embodiment, the recess holes 262 recessed from a sidewall of the interlayer insulating patterns 220 may be formed, and the data storage structures 288 may include the blocking insulating layers 266 and 284 in contact with the gate patterns 320 in the recess holes 262, the charge storage layers 280 in contact with the blocking insulating layers 266 and 284 in the recess holes 262, and the tunnel insulating layer 272 in contact with the charge storage layers 280 and extending in the stacking direction in the through holes 261

In an example embodiment, the recess holes 262 may be formed to have curved surfaces or sides, and the data storage structures 288 may have curved surfaces in contact with the curved recess holes 262. Thus, the data storage structures 288 may include curved-surface type data storage structures.

The data storage structures 288 of curved-surface type may include the blocking insulating layers 284 and 266 of curved-surface type, the charge storage layers 280 of curved-surface type being in contact with the blocking insulating layers 284 and 266 of curved-surface type, and the tunnel insulating layer 272 of curved-surface type being in contact with the charge storage layers 280 of curved-surface type in the recess holes 262 of curved-surface type and extending in the stacking direction in the through hole 261. The data storage structures 288 having a curved surface may be in contact with the gate patterns 320 through the curved surface, and electrical characteristics of the cell transistors M0, M1, and M2 may be improved.

In the present example embodiment, the gate patterns 320 and the interlayer insulating patterns 220 are alternately formed along a sidewall of the semiconductor pillar 274 with the data storage structures 288 between the gate patterns 320 and the interlayer insulating patterns 220. Accordingly, the cell transistors M0, M1, and M2 may be formed on the sidewall of the semiconductor pillar 274. The cell transistors M0~Mn respectively formed in the semiconductor pillars 274 may construct one cell string S. The cell transistors M0, M1, and M2 may be serially connected in the vertical direction along the semiconductor pillar 274.

The vertical structure VS may include the dummy charge storage layers 281 formed on the sidewall of the interlayer insulating patterns 220 toward the semiconductor pillar 274 in the through hole 261. The dummy charge storage layers 281 may have a curved-type surface profile. The dummy charge storage layers 281 may be partially formed on the sidewall of the interlayer insulating patterns 220. The dummy charge storage layers 281 may be layers in which charges are not stored during operation of the cell transistors M0, M1, and M2.

The vertical structure VS may include the isolated insulating layers 285 that are formed in contact with the charge storage layers 280 in the through hole 261. The isolated insulating layers 285 may include a silicon oxide or a metal oxide. The isolated insulating layers 285 may be integral with at least one insulating layer 284 of the blocking insulating layers 266 and 284.

In an example embodiment, when the recess holes 262 are formed to have a curved surface, the isolated insulating layers 285 may be formed in the curved recess holes 262 and the through holes 261 in the stacking direction while being in contact with the curved-surface type charge storage layers 280.

In the present example embodiment, the charge storage layers 280 are separated from the dummy charge storage layers by the isolated insulating layers 285. Thus, the charge storage layers 280 may be separated and insulated from the dummy charge storage layers 281 by the isolated insulating layers 285. The charge storage layers 280 and the dummy charge storage layers 281 may have a discontinuous structure in which the charge storage layers 280 and the dummy charge storage layers 281 do not extend in the through hole 261 in the stacking direction. The charge storage layers 280 and the dummy charge storage layers 281 may be on different lines in the stacking direction in the through hole 261.

In an example embodiment, when the recess holes 262 are formed to be recessed from the sidewall of the interlayer insulating patterns 220, the isolated insulating layers 285 may be formed in the stacking direction in contact with the charge storage layers 280 in the recess holes 262 and the through holes 261. The charge storage layers 280 may be separated from the dummy charge storage layers 281 by the isolated insulating layers 285.

In an example embodiment, when the recess holes 262 recessed from the sidewall of the interlayer insulating patterns 220 are formed, the isolated insulating layers 285 may be on the sidewall and under the interlayer insulating patterns 220. When the recess holes 262 are formed, the dummy charge storage layers 281, the isolated insulating layers 284, and the charge storage layers 280 may be connected to one another in the stacking direction in the recess holes 262 and the through holes 261.

In an example embodiment, when the curved-surface type recess holes 262 recessed from the sidewall of the interlayer insulating patterns 220 are formed, the semiconductor pillar 274 of curved-surface type may be on a sidewall of the tunnel insulating layer 272 of curved-surface type and a side of the dummy charge storage layers 281 and extend in the stacking direction in the through hole 261.

The gate patterns 320 may be formed in the cavities 278 between the interlayer insulating patterns 220 to be in contact with a sidewall of the data storage structures 288. A sidewall of the gate patterns 320 (facing the semiconductor pillar 274) may be in contact with a sidewall of the data storage structures 288.

The blocking insulating layers 266 and 284 constructing the data storage structures 288 may include a plurality of insulating layers. The blocking insulating layers 266 and 284 may include a first insulating layer 266 formed on a sidewall of the charge storage layer 280 and a second insulating layer 284 formed on the first insulating layer 266.

In an example embodiment, when the recess holes 262 recessed from the sidewall of the interlayer insulating patterns 220 are formed, the second insulating layers 284 of the blocking insulating layers 266 and 284 may be entirely in contact with the gate patterns 320 in the recess holes 262. Thus, the second insulating layers 284 constructing the blocking insulating layers 266 and 284 may be formed to be entirely in contact with the sidewall of the gate patterns 320.

In an example embodiment, when the curved-surface type recess holes 262 recessed from the sidewall of the interlayer insulating patterns 220 are formed, the blocking insulating layers 266 and 284 of curved-surface type may be entirely in contact with the gate patterns 320 in the recess holes 262 of curved-surface type. The blocking insulating layers 266 and 284 of curved-surface type may include the first insulating layers 266 on the sidewalls of the charge storage layers 280 and the second insulating layers 284 on sidewalls of the first insulating layers 266 and being in contact with the gate patterns 320.

The blocking insulating layers 266 and 284 may have a discontinuous structure in which the blocking insulating layers 266 and 284 do not extend in the through hole 261 in the stacking direction. The charge storage layers 280 constructing the data storage structures 288 may be partially formed on the sidewalls of the gate patterns 320. The tunnel insulating layer 272 may have a continuous structure that extends in the stacking direction in the through hole 261.

In the vertical non-volatile memory device 10 having the above-described structure, the charge storage layers 280 are separated and insulated by the isolated insulating layer 285. Accordingly, in the vertical non-volatile memory device 10, charge storage characteristics or charge retention characteristics of the charge storage layers 280 may be improved when the cell transistors M0, M1, and M2 operate.

In the vertical non-volatile memory device 10, the dummy charge storage layers 281 or the isolated insulating layers formed on the sidewalls of the interlayer insulating patterns 220 may improve an insulation property or a separation property between the cell transistors M0, M1, and M2.

In the vertical non-volatile memory device 10, the data storage structures 288 may be formed in the recess holes 262 recessed from the interlayer insulating patterns 220. In this case, as the cell transistors M0, M1, and M2 may be easily separated from one another, data storage characteristics of the vertical non-volatile memory device 10 may be improved.

In the vertical non-volatile memory device 10, the data storage structures 288 of curved-surface type may be formed in the recess holes 262 of curved-surface type recessed from the interlayer insulating patterns 220. In this case, the data storage structures 288 of curved-surface type may be in contact with the gate patterns 320 through curved surfaces, and thus, electrical properties of the cell transistors M0, M1, and M2 may be improved.

Figure 5A:
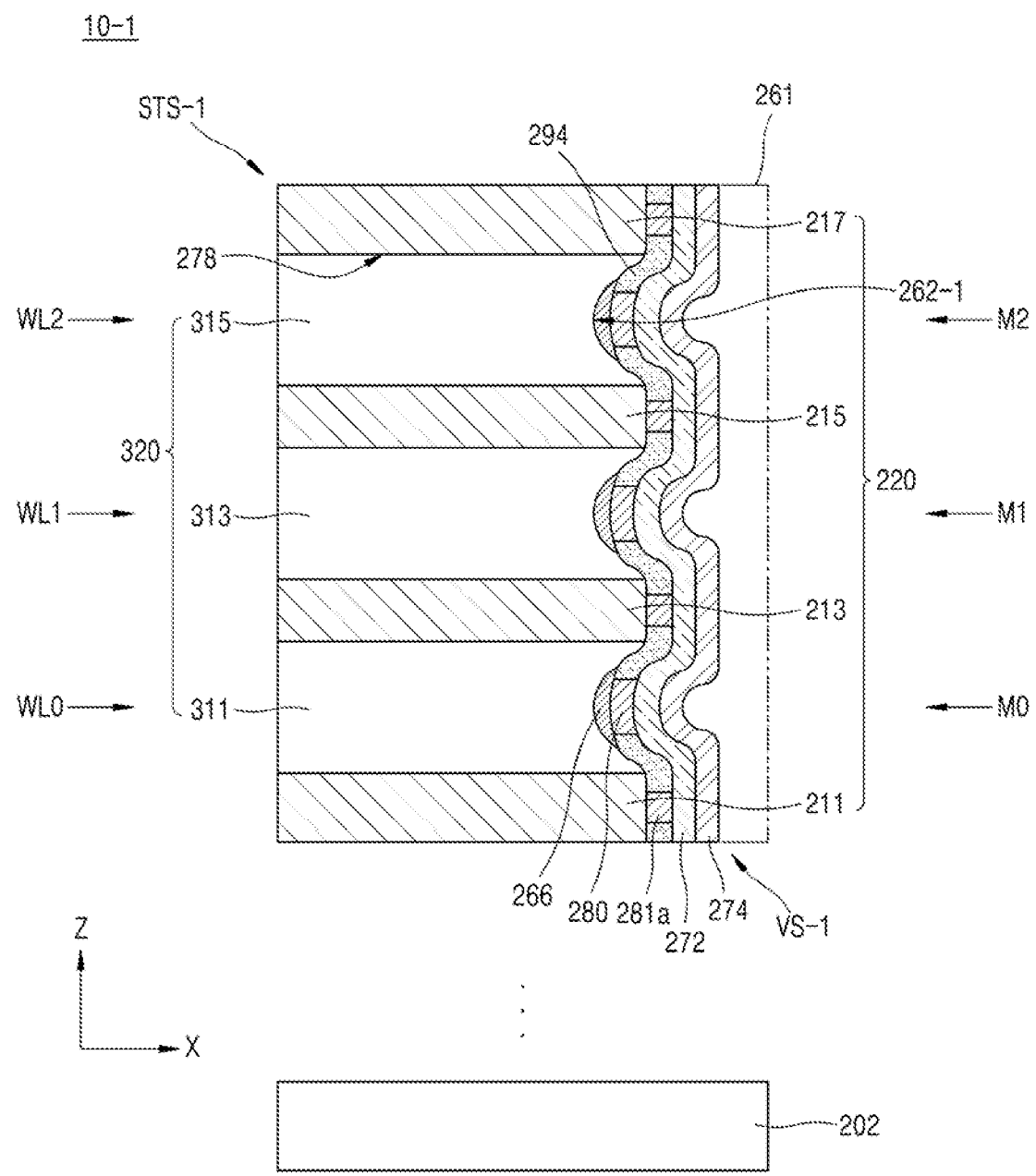
FIG. 5A illustrates a cross-sectional view of a vertical non-volatile memory device according to an example embodiment.
Figure 5B:
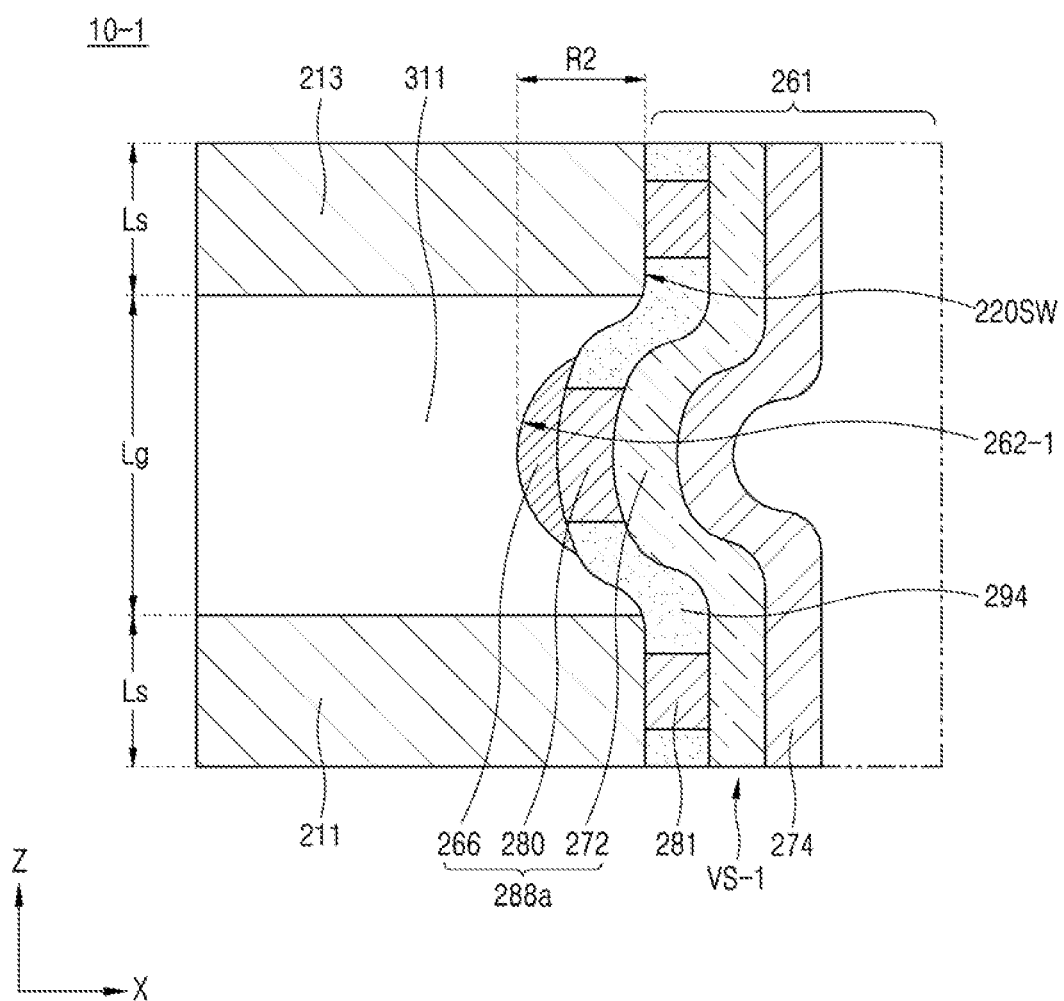
FIG. 5B illustrates an enlarged view of a region of FIG. 5A.

FIG. 5A is a cross-sectional view of a vertical non-volatile memory device 10-1 according to an example embodiment; and FIG. 5B is an enlarged view of a region of FIG. 5A.

Except for the differences in configurations of data storage structures 288a and isolated insulating layers 294, and a surface profile of dummy charge storage layers 281a, the vertical non-volatile memory device 10-1 of FIGS. 5A and 5B may be identical to the vertical non-volatile memory device 10 of FIGS. 4A and 4B. In FIGS. 5A and 5A, same members as those of FIGS. 4A and 4B are marked with same reference numerals, and some descriptions already set forth above may be briefly restated or omitted.

FIG. 5A illustrates the vertical non-volatile memory device 10-1 based on only a half (½) of the through hole 261 in FIG. 3. Accordingly, the vertical non-volatile memory device 10-1 of FIG. 5A may have a bilateral symmetrical structure along the through hole 261. Thus, the gate patterns 320 and the interlayer insulating patterns 220 may be formed on the right of the through hole 261.

In the present example embodiment, the vertical non-volatile memory device 10-1 includes a stack body STS-1. The stack body STS-1 includes the gate patterns 320 and the interlayer insulating patterns 220 alternately stacked on the substrate 202. The gate patterns 320 may be formed in the cavities 278 between the interlayer insulating patterns 220.

The stack body STS-1 may include the through hole 261 extending in the stacking direction, that is, the Z-direction, in the gate patterns 320 and the interlayer insulating patterns 220. The stack body STS-1 may include recess holes 262-1 recessed by a second depth R2 from the sidewall 220SW of the interlayer insulating patterns 220 in a direction of the gate patterns 320. The second depth R2 may be less than the first depth R1 of the stack body STS shown in FIGS. 4A and 4B.

In the present example embodiment, the second depth R2 may be less than the first depth R1 as a result of the isolated insulating layers 294 and 285 are formed differently. The recess holes 262-1 may communicate with the through holes 261. Surfaces of the recess holes 262-1 being in contact with the gate patterns 320 may be curved surfaces.

When the recess holes 262-1 are formed, the data storage structures 288a may be formed or buried in the recess holes 262-1, and thus, separation between the cell transistors M0, M1, and M2 may be easily performed. In another implementation, the recess holes 262-1 may not be formed.

A vertical structure VS-1 may be formed in the through hole 261. The vertical structure VS-1 may include the semiconductor pillar 274 extending in the stacking direction in the through hole 261. In the through hole 261, the data storage structures 288a may be between the gate patterns 320 and the semiconductor pillar 274. When the recess holes 262-1 are formed, the semiconductor pillar 274 may be in contact with the data storage structures 288a and extend in the stacking direction in the through hole 261 and the recess holes 262-1.

The data storage structures 288a may include the tunnel insulating layer 272, the charge storage layers 280, and the blocking insulating layers 266 sequentially stacked in the direction of the gate patterns 320 on the semiconductor pillar 274. Compared to FIGS. 4A and 4B, the data storage structures 288a may include the blocking insulating layers 266 each including a single insulating layer. The blocking insulating layers 266 may include a silicon oxide or a metal oxide.

The vertical structure VS-1 may include dummy charge storage layers 281a formed on the sidewall of the interlayer insulating patterns 220 toward the semiconductor pillar 274 in the through hole 261. Surface profiles of the dummy charge storage layers 281a may be different from surface profiles of the dummy charge storage layers 281 shown in FIGS. 4A and 4B. Thus, the dummy charge storage layers 281a may have straight-line type surface profiles.

The vertical structure VS-1 may include isolated insulating layers 294 formed in contact with the charge storage layers 280 in the through hole 261. The isolated insulating layers 294 may include a silicon oxide or a metal oxide. As compared to the isolated insulating layers 285 of FIGS. 4A and 4B, the isolated insulating layers 294 may not be integrally formed with the blocking insulating layers 266.

The charge storage layers 280 are separated and insulated from the dummy charge storage layers 281a by the isolated insulating layer 294. The charge storage layers 280 and the dummy charge storage layers 281 may have discontinuous structures in which the charge storage layers 280 and the dummy charge storage layers 281a do not extend in the stacking direction in the through hole 261. The charge storage layers 280 and the dummy charge storage layers 281 may be on different lines in the stacking direction in the through hole 261.

In an example embodiment, when the recess holes 262-1 recessed from the sidewall of the interlayer insulating patterns 220 are formed, the isolated insulating layers 294 may be on the sidewalls and under the interlayer insulating patterns 220. When the recess holes 262-1 are formed, the dummy charge storage layer 281, the isolated insulating layers 294, and the charge storage layers 280 may be connected to one another in the stacking direction in the recess holes 262 and the through hole 261.

The blocking insulating layers 266 constructing the data storage structures 288a may each include a single insulating layer. In an example embodiment, when the recess holes 262-1 recessed from the sidewall of the interlayer insulating patterns 220 are formed, the blocking insulating layers 266 may be entirely in contact with the gate patterns 320 in the recess holes 262-1. Thus, the blocking insulating layers 266 may be formed to be entirely in contact with the sidewalls of the gate patterns 320. The blocking insulating layers 266 may have a discontinuous structure in which the blocking insulating layers 266 do not extend in the stacking direction in the through hole 261.

The vertical non-volatile memory device 10-1 having the above-described structure may have the same advantages as those of the vertical non-volatile memory device 10 of FIGS. 4A and 4B.

FIGS. 6A through 6K are cross-sectional views for describing a method of manufacturing the vertical non-volatile memory device 10 according to an example embodiment.

FIGS. 6A through 6E are views illustrating stages in a method of manufacturing the vertical non-volatile memory device 10 of FIGS. 4A and 4B.

In FIGS. 6A through 6K, same members as those of FIGS. 4A and 4B are marked with same reference numerals, and some descriptions set forth above may be briefly restated or omitted.

Figure 6A:
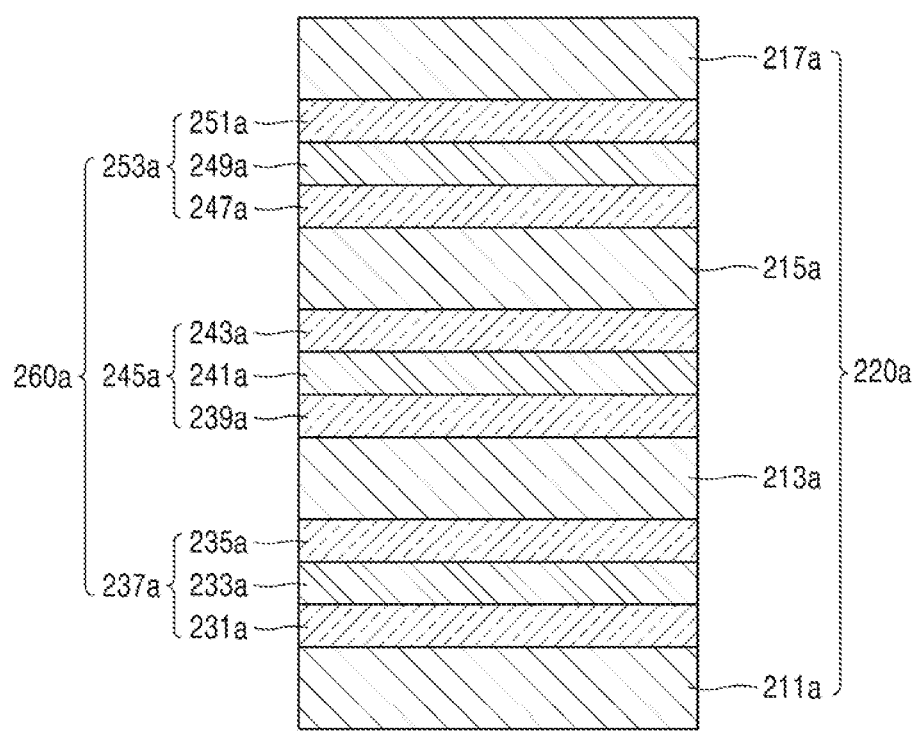
FIGS. 6A through 6K illustrate cross-sectional views for describing a method of manufacturing a vertical non-volatile memory device, according to an example embodiment.

In the present example embodiment, referring to FIG. 6A, interlayer insulating layers 220a and sacrificial layers 260a are alternately stacked several times on the substrate 202 (see FIGS. 4A and 4B). For example, as shown in FIG. 6A, a first interlayer insulating layer 211a, a first sacrificial layer 237a, a second interlayer insulating layer 213a, a second sacrificial layer 245a, a third interlayer insulating layer 215a, a third sacrificial layer 253a, and a fourth interlayer insulating layer 217a may be sequentially formed on the substrate 202.

Although FIG. 6A shows that the interlayer insulating layer 220a and the sacrificial layer 260a are alternately formed on the substrate 202, the sacrificial layer 260a and the interlayer insulating layer 220a may be alternately formed on the substrate 202. The sacrificial layer 260a may be a mold layer.

The sacrificial layer 260a and the interlayer insulating layer 220a may be formed by a chemical vapor deposition method. The sacrificial layer 260a may include a material having an etch selectivity with the interlayer insulating layer 220a. The sacrificial layer 260a may include a material that may be easily removed by a wet-etching process. The sacrificial layer 260a may include silicon nitride. The interlayer insulating layer 220a may include silicon oxide.

The first sacrificial layer 237a may include a triple layer of a first lower sacrificial layer 231a, a first intermediate sacrificial layer 233a, and a first upper sacrificial layer 235a. The first intermediate sacrificial layer 233a may include a material that has an etch rate higher than that of the first lower sacrificial layer 231a and that of a material of the first upper sacrificial layer 235a. In an example embodiment, the first intermediate sacrificial layer 233a may include a silicon nitride (SiN) that has a higher nitrogen (N) concentration than that of a SiN of the first lower sacrificial layer 231a and a SiN of the first upper sacrificial layer 235a.

The second sacrificial layer 245a may include a triple layer of a second lower sacrificial layer 239a, a second intermediate sacrificial layer 241a, and a second upper sacrificial layer 243a. The second intermediate sacrificial layer 241a may include a material that has an etch rate higher than that of a material of the second lower sacrificial layer 239a and that of a material of the second upper sacrificial layer 243a. In an example embodiment, the second intermediate sacrificial layer 241a may include SiN that has a higher nitrogen concentration than that of a SiN of the second lower sacrificial layer 239a and a SiN of the second upper sacrificial layer 243a.

The third sacrificial layer 253a may include a triple layer of a third lower sacrificial layer 247a, a third intermediate sacrificial layer 249a, and a third upper sacrificial layer 251a. The third intermediate sacrificial layer 249a may include a material that has an etch rate higher than that of a material of the third lower sacrificial layer 247a and that of a material of the third upper sacrificial layer 251a. In an example embodiment, the third intermediate sacrificial layer 249a may include SiN that has a higher nitrogen concentration than that of a SiN of the third lower sacrificial layer 247a and a SiN of the third upper sacrificial layer 251a.

Figure 6B:
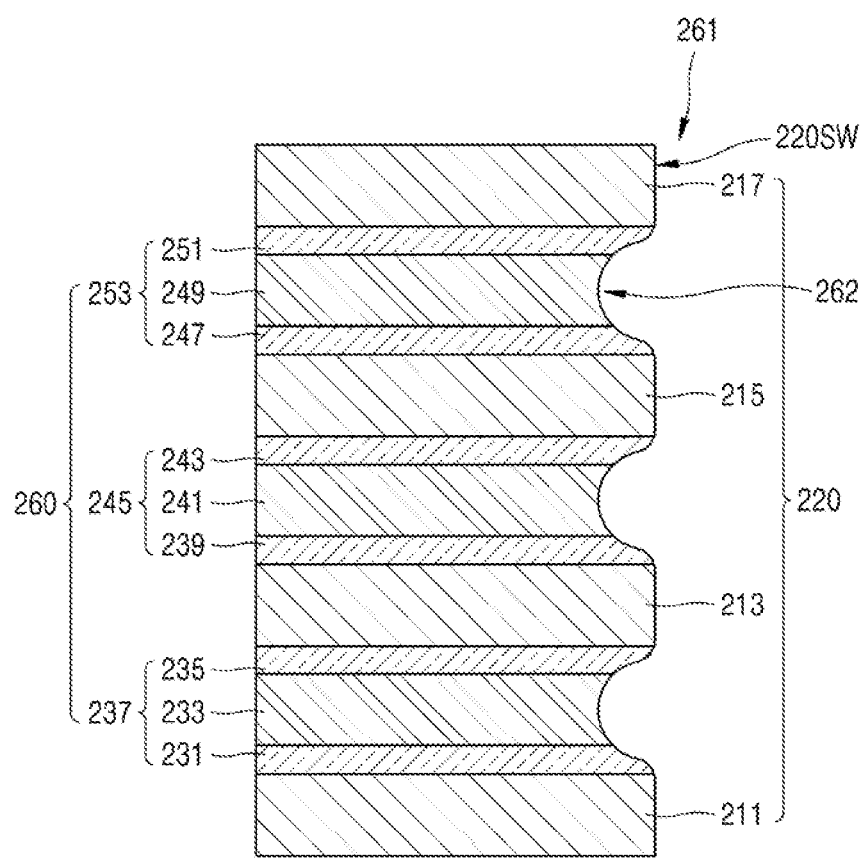

Referring to FIG. 6B, a sacrificial patterns 260 and the interlayer insulating patterns 220 may be formed by etching the sacrificial layer 260a and the interlayer insulating layer 220a. The sacrificial patterns 260 may include first sacrificial patterns 237, second sacrificial patterns 245, and third sacrificial patterns 253.

The first sacrificial pattern 237 may include a triple pattern of a first lower sacrificial pattern 231, a first intermediate sacrificial pattern 233, and a first upper sacrificial pattern 235. The second sacrificial pattern 245 may include a triple pattern of a second lower sacrificial pattern 239, a second intermediate sacrificial pattern 241, and a second upper sacrificial pattern 243.

The third sacrificial pattern 253 may include a triple pattern of a third lower sacrificial pattern 247, a third intermediate sacrificial pattern 249, and a third upper sacrificial pattern 251. The interlayer insulating pattern 220 may include a first interlayer insulating pattern 211, a second interlayer insulating pattern 213, a third interlayer insulating pattern 215, and a fourth interlayer insulating pattern 217.

The recess holes 262 recessed from a sidewall 220SW of the interlayer insulating patterns 220 may be formed on one side of the sacrificial patterns 260. A sidewall of the recess holes 262 may be curved-surface type. The first, second, and third intermediate sacrificial patterns 233, 241, and 249 constructing the sacrificial patterns 260 may have an etch rate higher than those of the first, second, and third lower sacrificial patterns 231, 239, and 247 and the first, second, and third upper sacrificial patterns 235, 243, and 251, and thus, the sidewall of the recess holes 262 may be formed to have curved surfaces.

In an example embodiment, the through hole 261 penetrating upper and lower portions of the sacrificial patterns 260 and the interlayer insulating patterns 220 may be formed. When the through hole 261 is formed, the recess holes 262 may communicate with the through hole 261. The through hole 261 may be a channel hole.

Figure 6C:
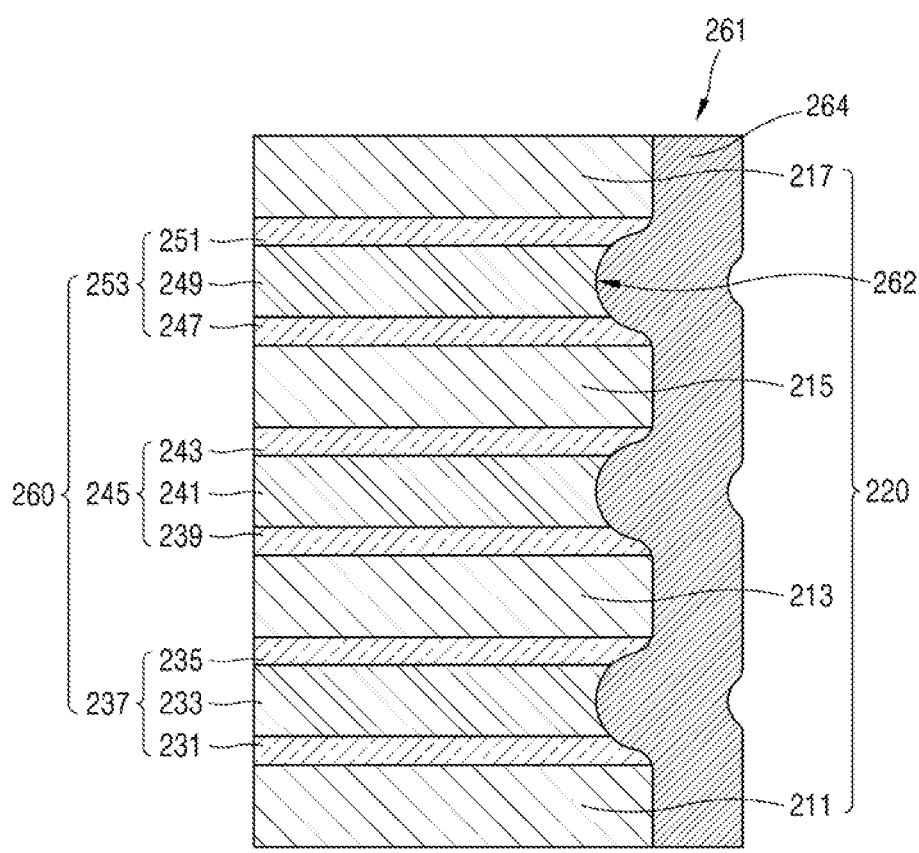
Figure 6D:
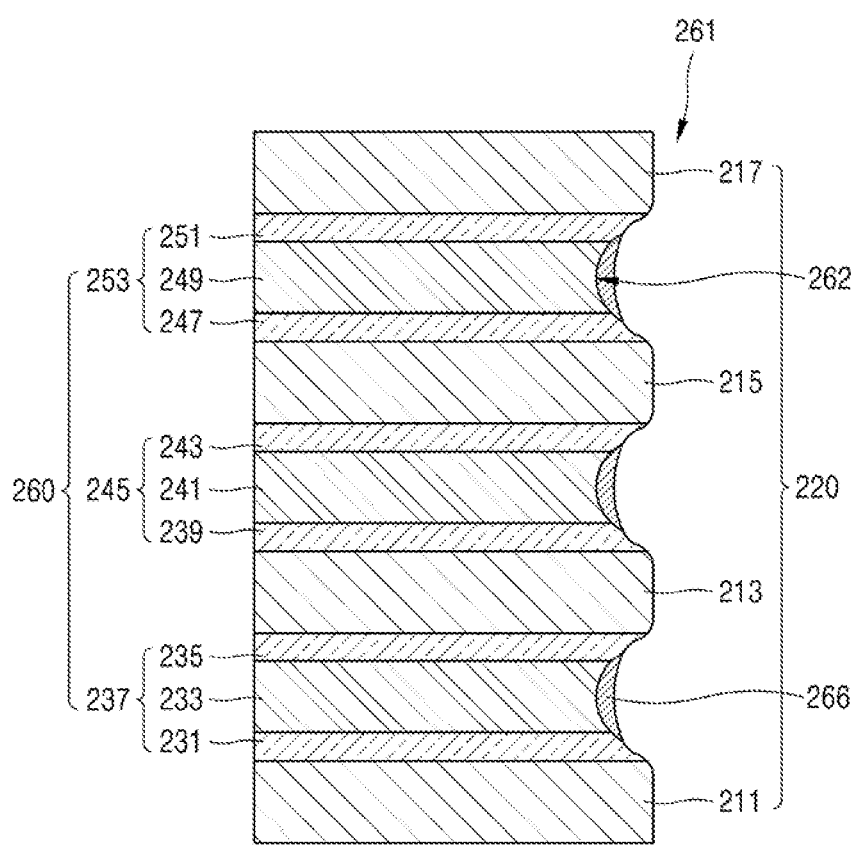
Figure 6E:
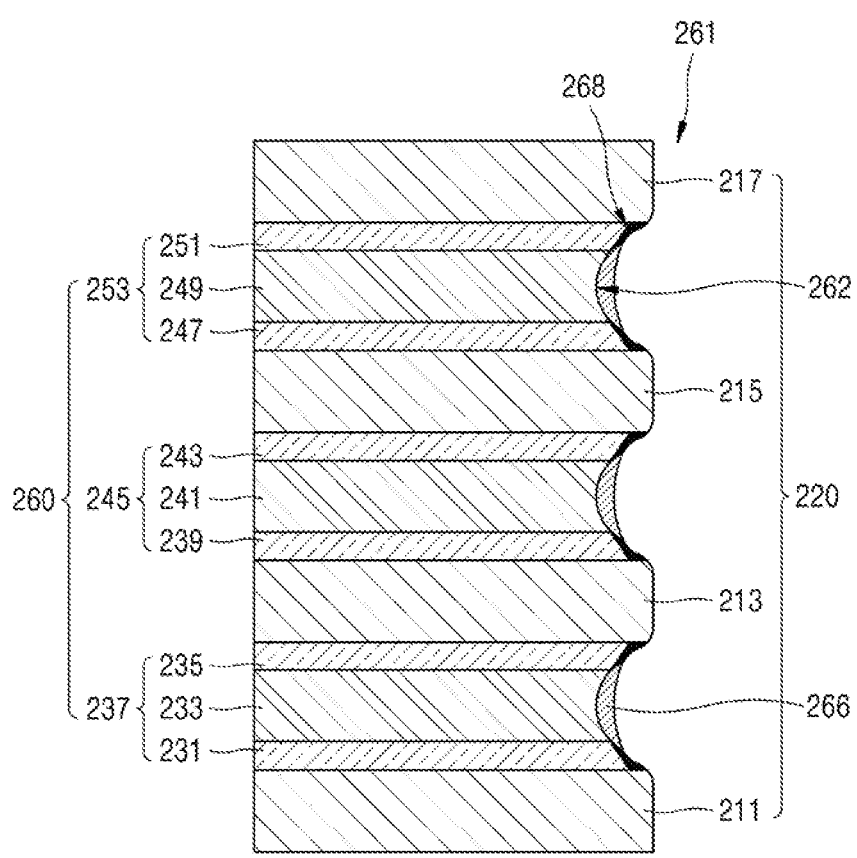

Referring to FIGS. 6C through 6E, a first insulating layer 264 for burying the recess holes 262 and the through holes 261 may be formed, as shown in FIG. 6C. The first insulating layer 264 may include, for example, SiN.

As shown in FIG. 6D, the first insulating layer 264 may be etched to form the first blocking insulating layers 266 in the recess holes 262. Thus, the first blocking insulating layers 266 may be formed on a sidewall of the sacrificial patterns 260. The first blocking insulating layers 266 may be formed in portions in the recess holes 262. The first blocking layers 266 may protect the charge storage layers in following processes.

As shown in FIG. 6E, reinforcement layers 268 may be formed at upper and lower edges of the first blocking insulating layers 266 in the recess holes 262. The reinforcement layers 268 may be formed on one side of each of the first lower sacrificial pattern 231, the first upper sacrificial pattern 235, the second lower sacrificial pattern 239, the second upper sacrificial pattern 243, the third lower sacrificial pattern 247, and the third upper sacrificial pattern 251.

The reinforcement layers 268 may be formed by oxidizing some portions in the recess holes 262. The reinforcement layers 268 may include silicon oxide. The reinforcement layers 268 may protect the charge storage layers 280 (see FIG. 6I) in following processes.

Figure 6F:
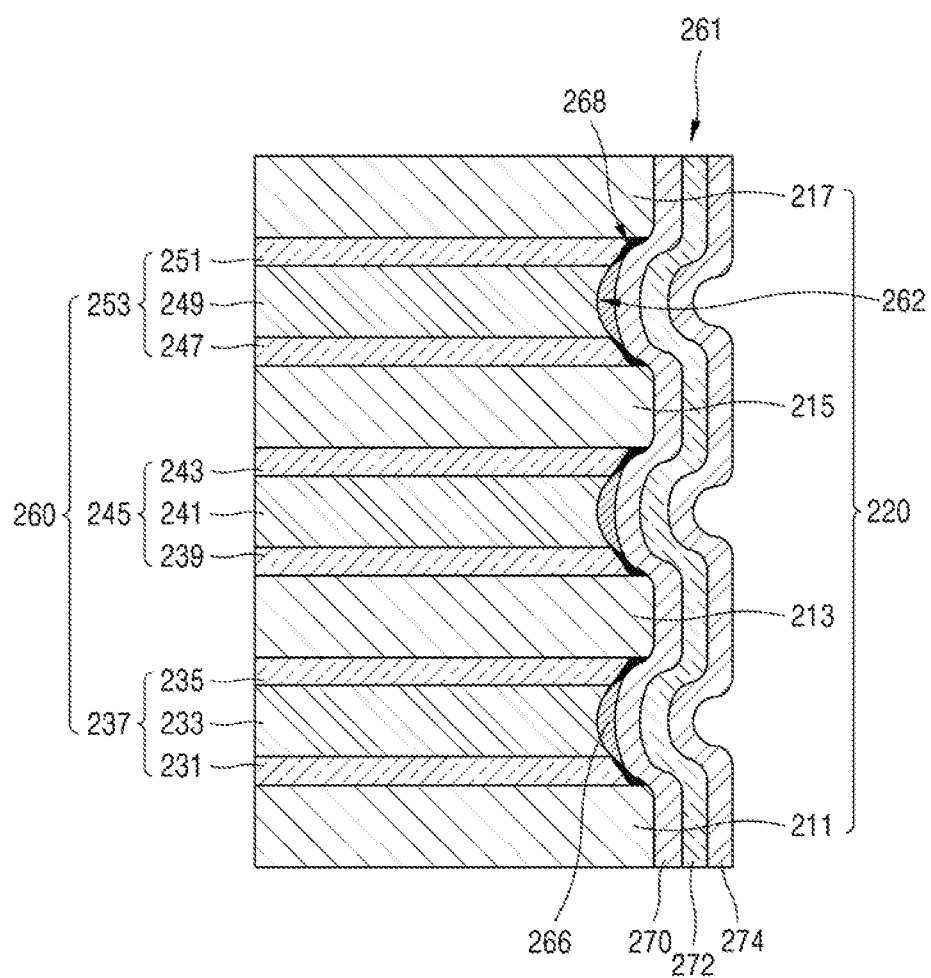

Referring to FIG. 6F, a charge storage material layer 270, the tunnel insulating layer 272, and the semiconductor pillar 274 may be formed in the stacking direction in the recess holes 262 and the through holes 261. The charge storage material layer 270 may be formed at one side of the first blocking insulating layers 266 and the reinforcement layers 268 in the recess holes 262.

The charge storage material layer 270 may include SiN. The tunnel insulating layer 272 may be formed in the stacking direction on one side of the charge storage material layer 270. The tunnel insulating layer 272 may include silicon oxide. The semiconductor pillar 274 may be formed in the stacking direction at one side of the tunnel insulating layer 272.

Figure 6G:
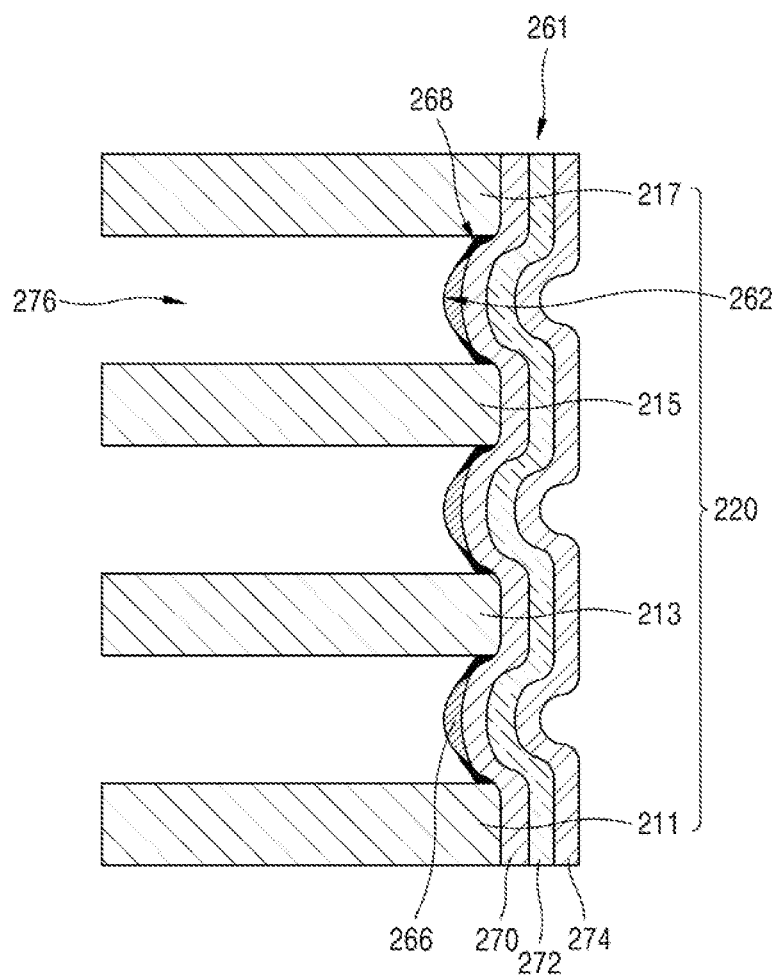
Figure 6H:
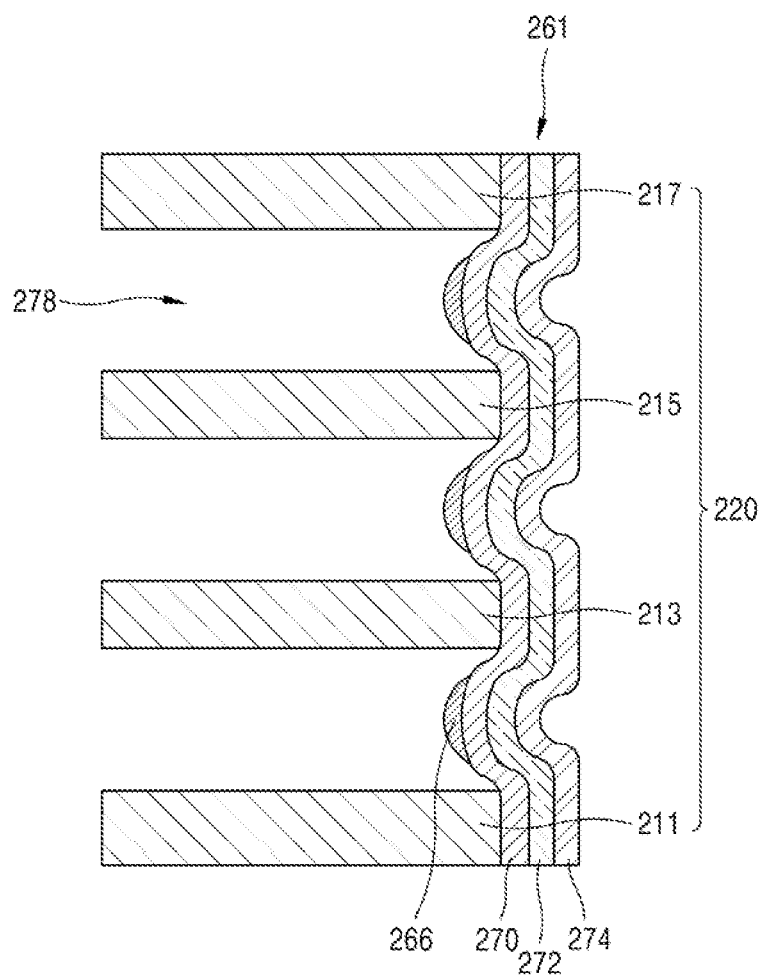

Referring to FIGS. 6G and 6H, the sacrificial patterns 260 between the interlayer insulating patterns 220 may be removed by an etching process to form preliminary cavities 276 between the interlayer insulating patterns 220, as shown in FIG. 6G. The sacrificial patterns 260 may have etching selectivity with respect to the interlayer insulating patterns 220. Thus, the sacrificial patterns 260 may be easily removed by the etching process.

As shown in FIG. 6H, a height of the first cavity 276 may be further increased by further etching a side of the interlayer insulating patterns 220 to form a final cavity 278. Hereinafter, the final cavity 278 is referred to as the cavity 278. When the sacrificial patterns 260 of FIG. 6G are etched, the reinforcement layers 269 may also be removed by etching. When the sacrificial patterns 260 of FIG. 6G are etched, the reinforcement layers 268 may be used for protecting the charge storage material layer 270.

Figure 6I:
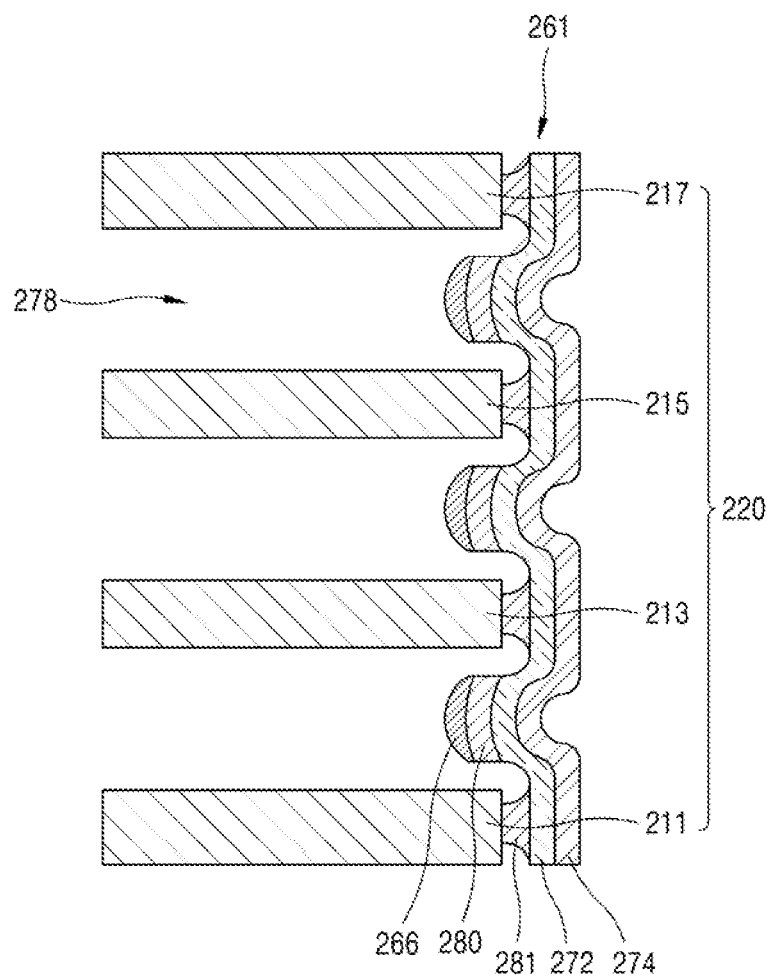
Figure 6J:
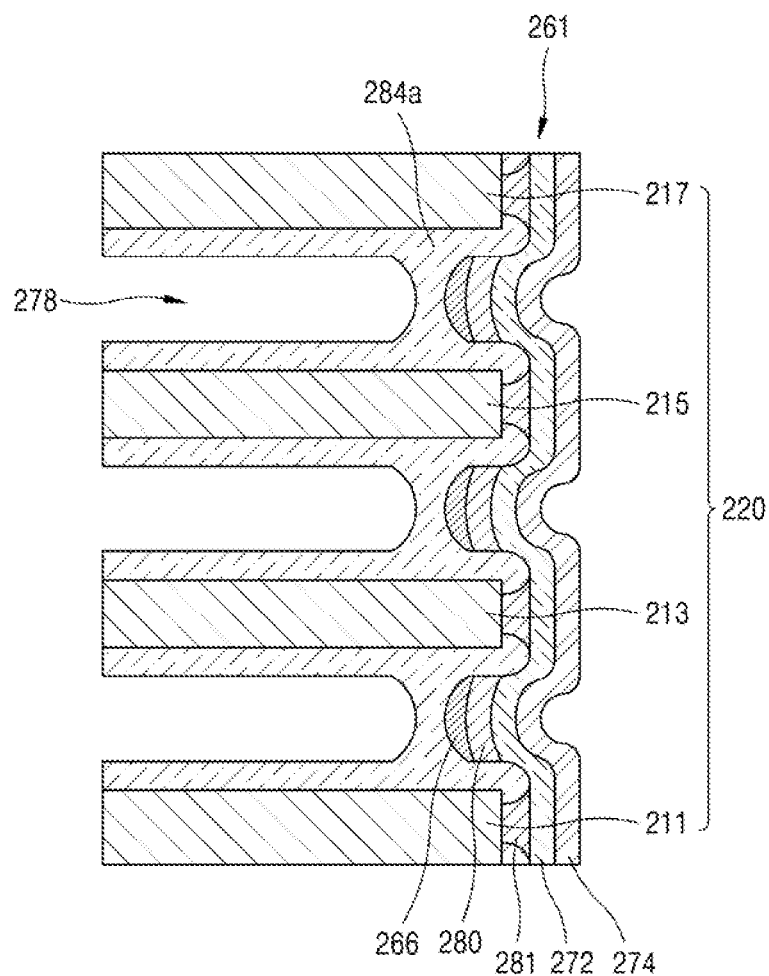

Referring to FIGS. 6I and 6J, the charge storage material layer 270 may be etched by using the first blocking layers 266 as etching masks to form the charge storage layers 280, as shown in FIG. 6I. Through the cavity 278, the charge storage material layer 270 may be etched by using the first blocking insulating layers 266 as the etching masks. Thus, the charge storage layers 280 may be formed at one side of the first blocking layers 266 and one side of the tunnel insulating layer 272. When the charge storage layers 280 are formed, the dummy charge storage layer 281 may be formed on the sidewall of the interlayer insulating patterns 220. As such, the charge storage layers 280 and the dummy charge storage layers 281 may be separated from each other.

As shown in FIG. 6J, in the cavity 278, a second insulating layer 284a may be formed on and beside the first blocking insulating layers 266, the charge storage layers 280, and the dummy charge storage layers 281, and on the sidewall of the interlayer insulating patterns 220. The second insulating layer 284a may include, for example, SiN.

Figure 6K:
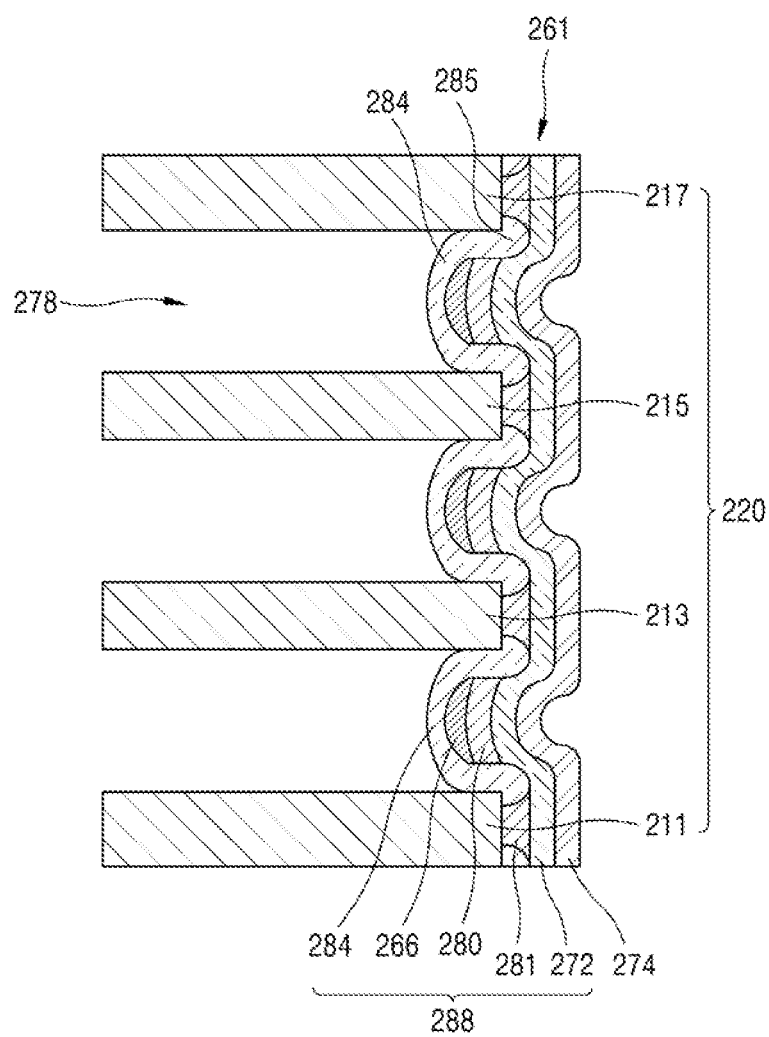

Referring to FIG. 6K, the second insulating layer 284a may be etched to form the second blocking insulating layers 284. Thus, the data storage structures 288 including the tunnel insulating layer 272, the charge storage layers 280, and the first and second blocking insulating layers 266 and 284 may be formed at one side of the semiconductor pillar 274.

In addition, the isolated insulating layers 285 may be formed between the charge storage layers 280 and the dummy charge storage layers 281. The second blocking insulating layers 284 and the isolated insulating layers 285 may include a same material.

Subsequently, as shown in FIGS. 4A and 4B, the gate patterns 320 may be formed in the cavity 278 to complete the vertical non-volatile memory device 10 (see FIGS. 4A and 4B).

FIGS. 7A through 7H are cross-sectional views for describing a method of manufacturing a vertical non-volatile memory device according to an example embodiment.

FIGS. 7A through 7H illustrate stages in a method of manufacturing the vertical non-volatile memory device 10 of FIGS. 4A and 4B.

Except for forming reinforcement layers 292 on an entire portion in the recess holes 262, FIGS. 7A through 7H may be almost identical to FIGS. 6A through 6K. In FIGS. 7A through 7H, same members as those of FIGS. 4A and 4B, 6A through 6K are marked with same reference numerals, and descriptions set forth above may be briefly restated or omitted.

Figure 7A:
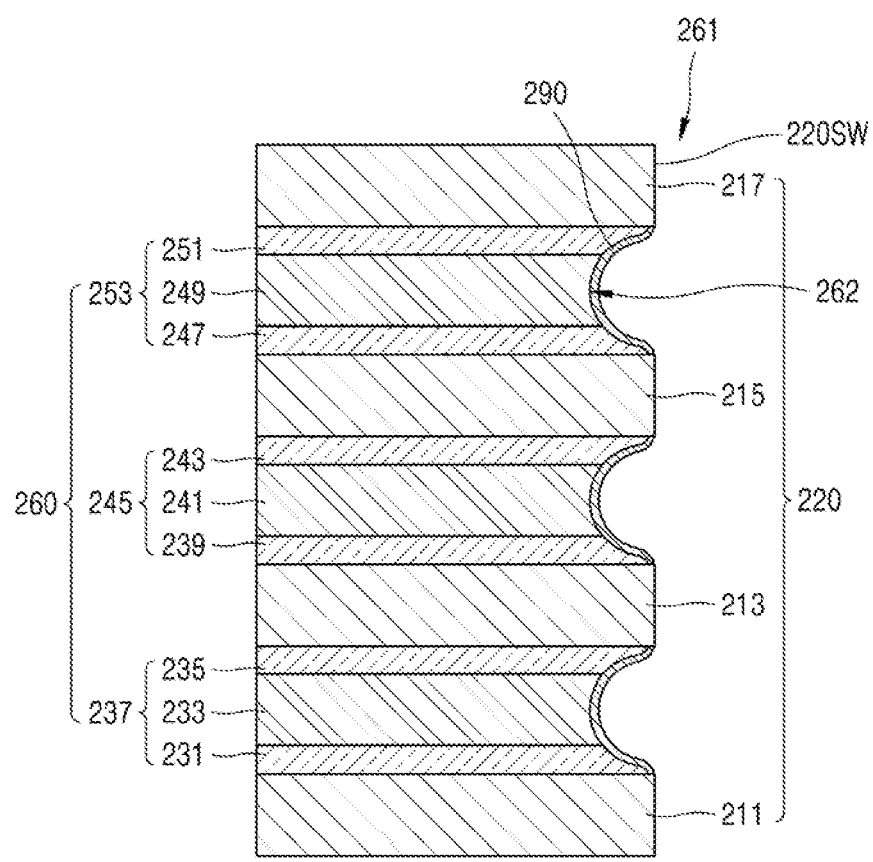
FIGS. 7A through 7H illustrate cross-sectional views for describing a method of manufacturing a vertical non-volatile memory device, according to an example embodiment.

Referring to FIG. 7A, the manufacturing processes shown in FIGS. 6A and 6B are performed. Next, reinforcement material layers 290 may be formed in the recess holes 262. The reinforcement material layers 290 may be formed entirely in the recess holes 262. The reinforcement material layers 290 may be formed at one side of the first lower sacrificial pattern 231, the first interlayer sacrificial pattern 233, the first upper sacrificial pattern 235, the second lower sacrificial pattern 239, the second interlayer sacrificial pattern 233, the second upper sacrificial pattern 243, the third lower sacrificial pattern 247, the third interlayer sacrificial pattern 249, and the third upper sacrificial pattern 251.

The reinforcement material layer 290 may be formed by, for example, generally oxidizing the inner portions of the recess holes 262. The reinforcement material layers 290 may include, for example, silicon oxide. The reinforcement material layers 290 may protect the charge storage layers 280 (see FIG. 7H) in following processes.

Figure 7B:
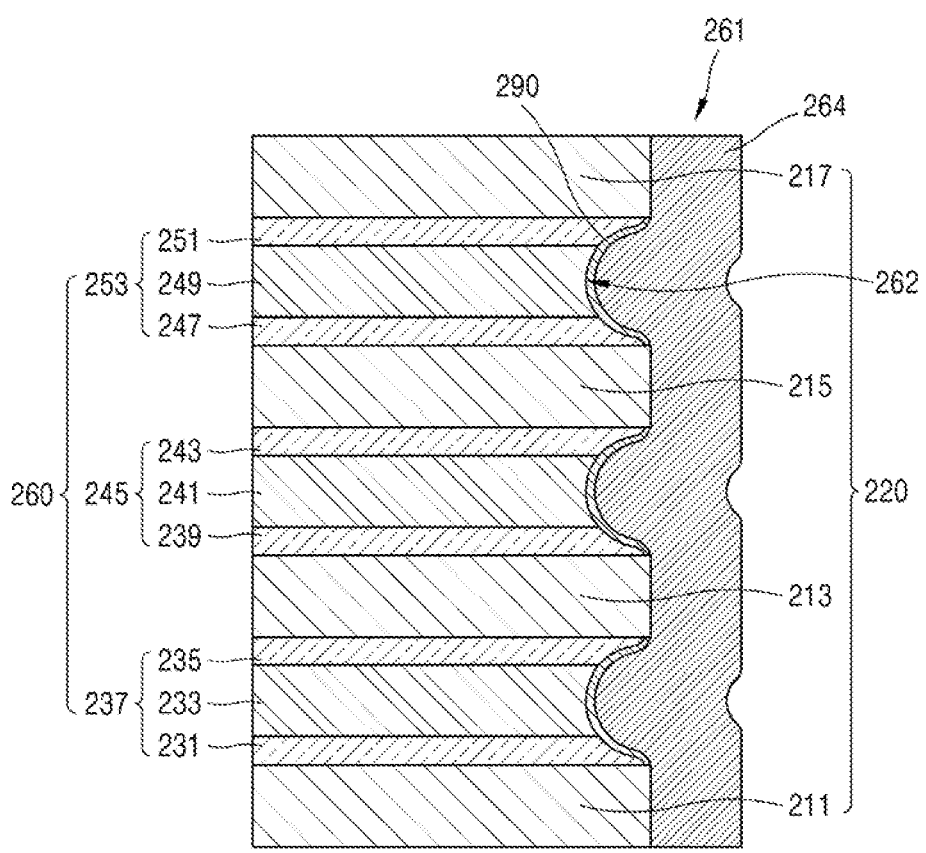
Figure 7C:
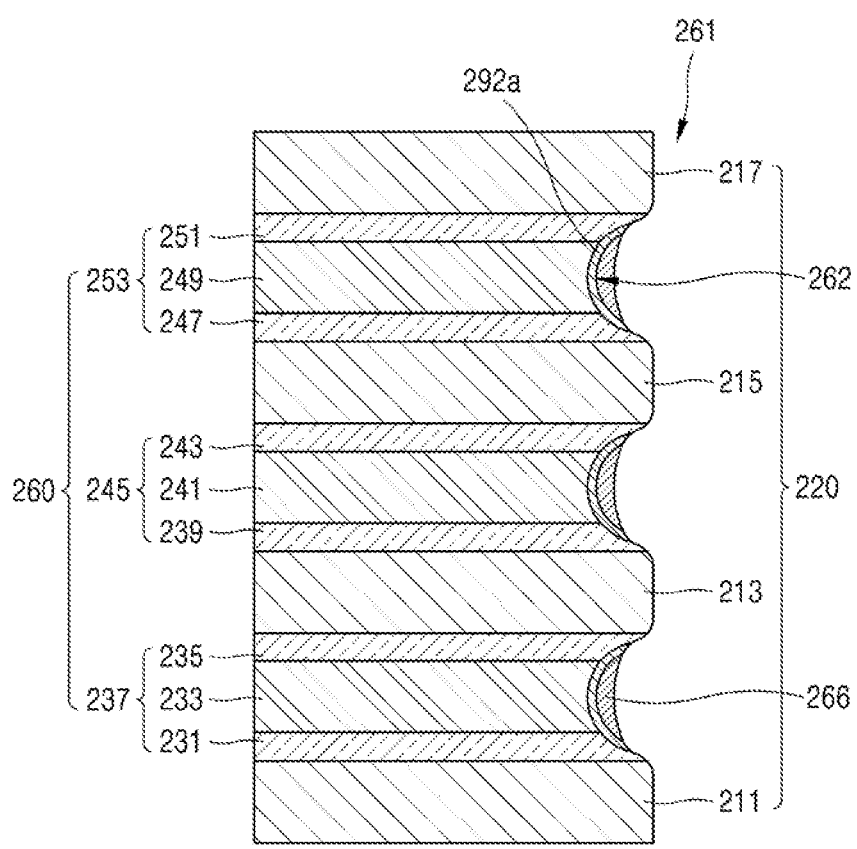

Referring to FIGS. 7B and 7C, a first insulating layer 264 (burying the recess holes 262 in which the reinforcement material layer 290 is formed) and the through hole 261 may be formed, as shown in FIG. 7B. The first insulating layer 264 includes SiN.

In detail, as shown in FIG. 7C, the first insulating layer 264 may be etched to form the first blocking insulating layers 266 in the recess holes 262. Thus, the first blocking insulating layers 266 may be formed on a side wall of the sacrificial patterns 260. When the first blocking insulating layers 266 are formed, the reinforcement material layer 290 may be partially etched and be first reinforcement layers 292a. The first reinforcement layers 292a may be formed in some portions in the recess holes 262.

The first reinforcement layers 292a may not be formed on some sidewalls of the first lower sacrificial pattern 231, the first upper sacrificial pattern 235, the second lower sacrificial pattern 239, the second upper sacrificial pattern 243, the third lower sacrificial pattern 247, and the third upper sacrificial pattern 251. The first reinforcement layers 292a may not be formed at upper and lower edges of the first blocking insulating layers 266.

Figure 7D:
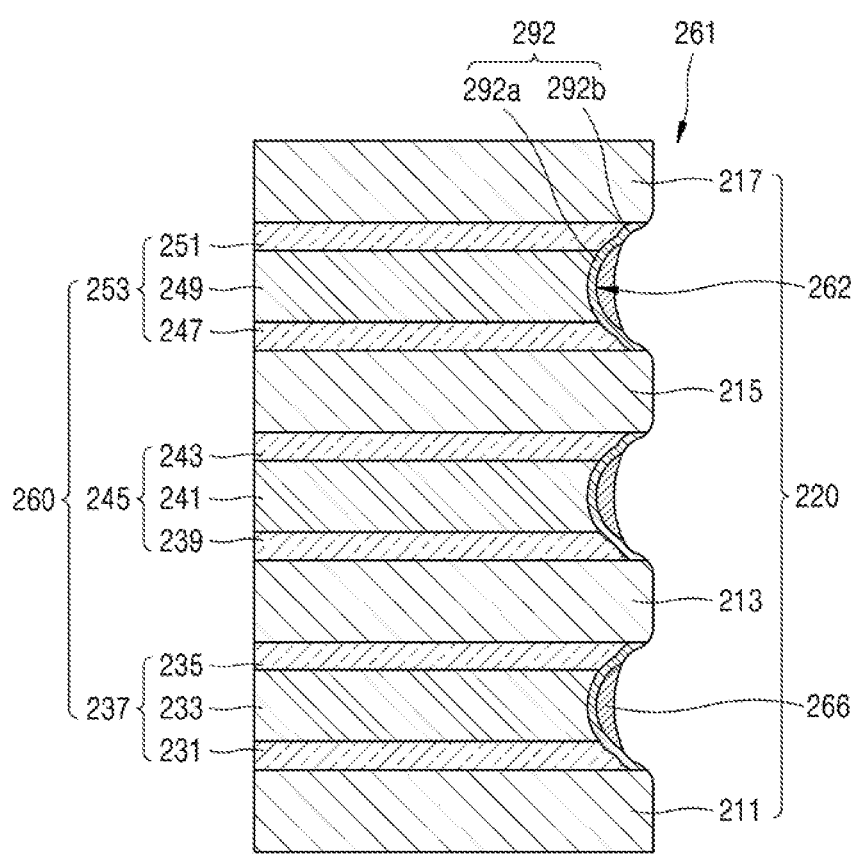

As shown in FIG. 7D, second reinforcement layers 292b may be formed in contact with upper and lower edge portions of the first blocking insulating layers 266 and the first reinforcement layers 292a. The second reinforcement layers 292b may be formed on one side of the first lower sacrificial pattern 231, the first upper sacrificial pattern 235, the second lower sacrificial pattern 239, the second upper sacrificial pattern 243, the third lower sacrificial pattern 247, and the third upper sacrificial pattern 251.

The second reinforcement layers 292 may be formed by oxidizing the inner portions of the recess holes 262. The second reinforcement layers 292b may include silicon oxide. The second reinforcement layers 292b may protect the charge storage layers 280 (see FIG. 6I) in following processes.

A reinforcement layer 292 including the first reinforcement layers 292a and the second reinforcement layers 292b may be formed in the recess holes 262. Thus, the reinforcement layer 292 may be formed entirely in the recess holes 262.

Figure 7E:
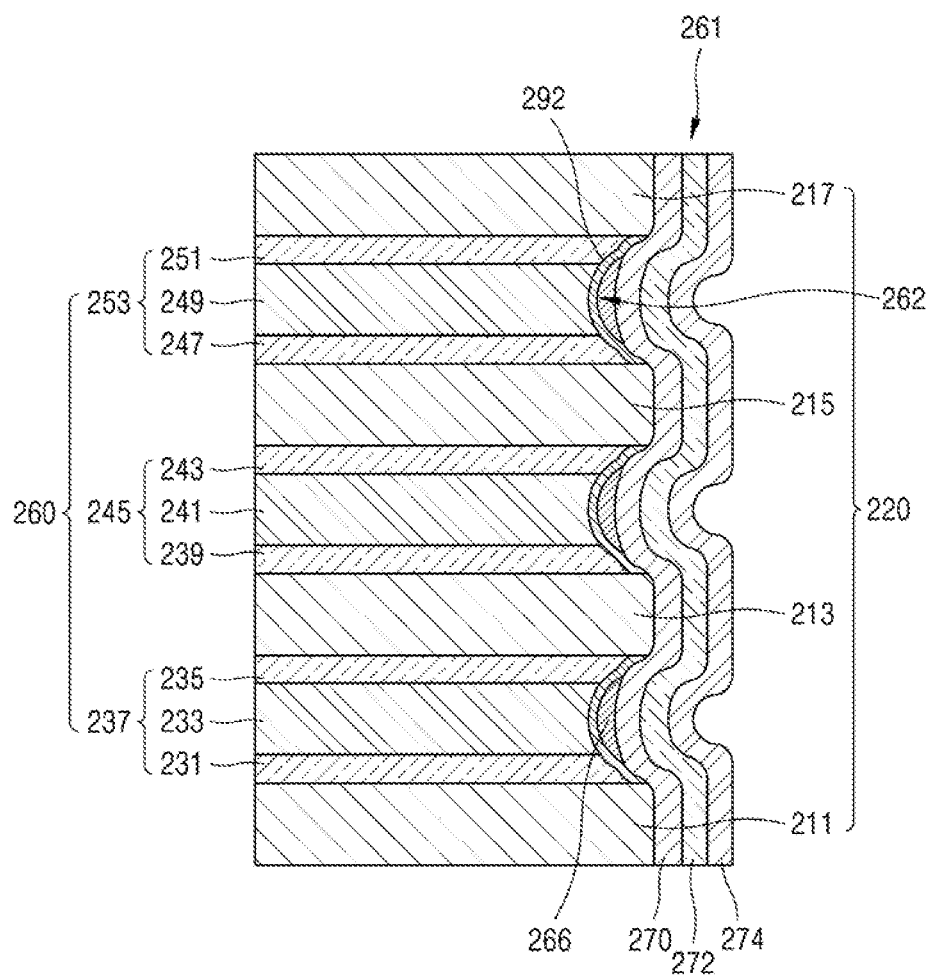
Figure 7F:
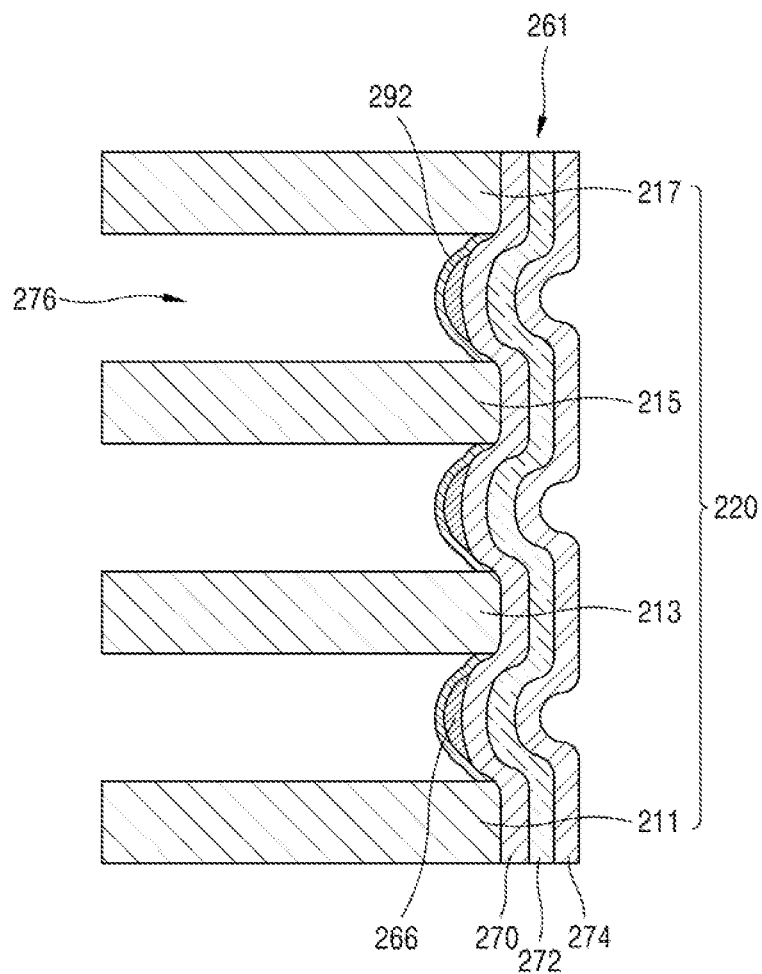

Referring to FIGS. 7E and 7F, as shown in FIG. 7E, the charge storage material layer 270, the tunnel insulating layer 272, and the semiconductor pillar 274 may be formed in the stacking direction, for example, so as to extend in the Z direction, in the recess holes 262 and the through hole 261. The charge storage material layer 270 may be formed at one side of the first blocking insulating layers 266 and the reinforcement layers 292 in the recess holes 262.

As shown in FIG. 7F, the sacrificial patterns 260 between the interlayer insulating patterns 220 may be removed by the etching process to form the preliminary cavity 276 between the interlayer insulating patterns 220. The sacrificial patterns 260 may have etching selectivity with the interlayer insulating patterns 220. Thus, the sacrificial patterns 260 may be easily removed by the etching process.

Figure 7G:
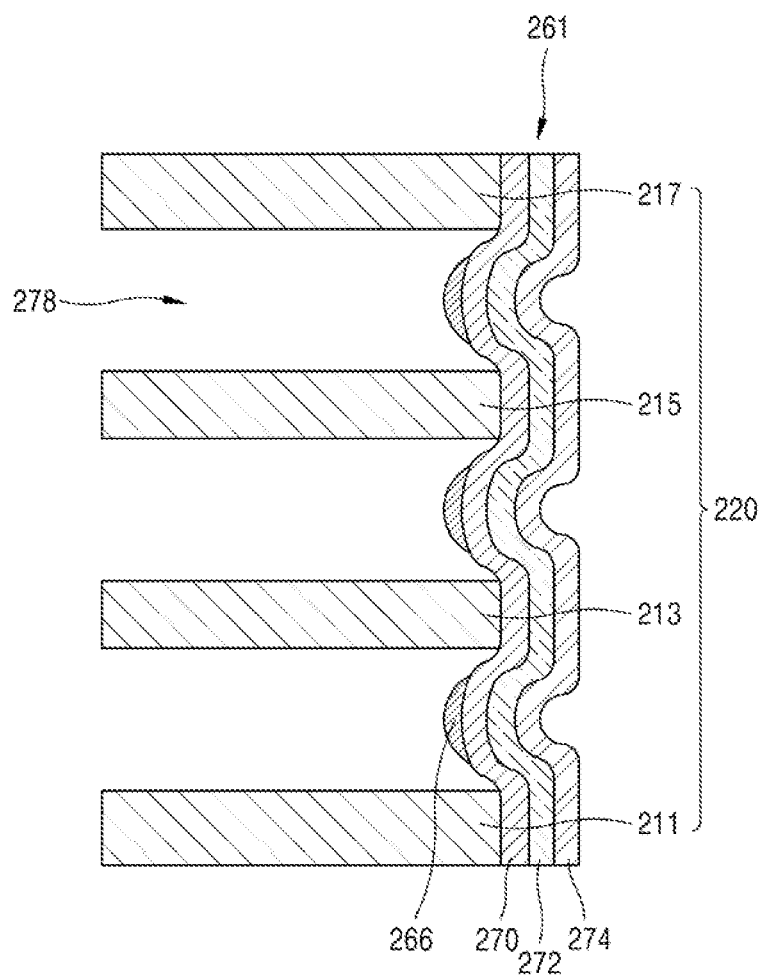
Figure 7H:
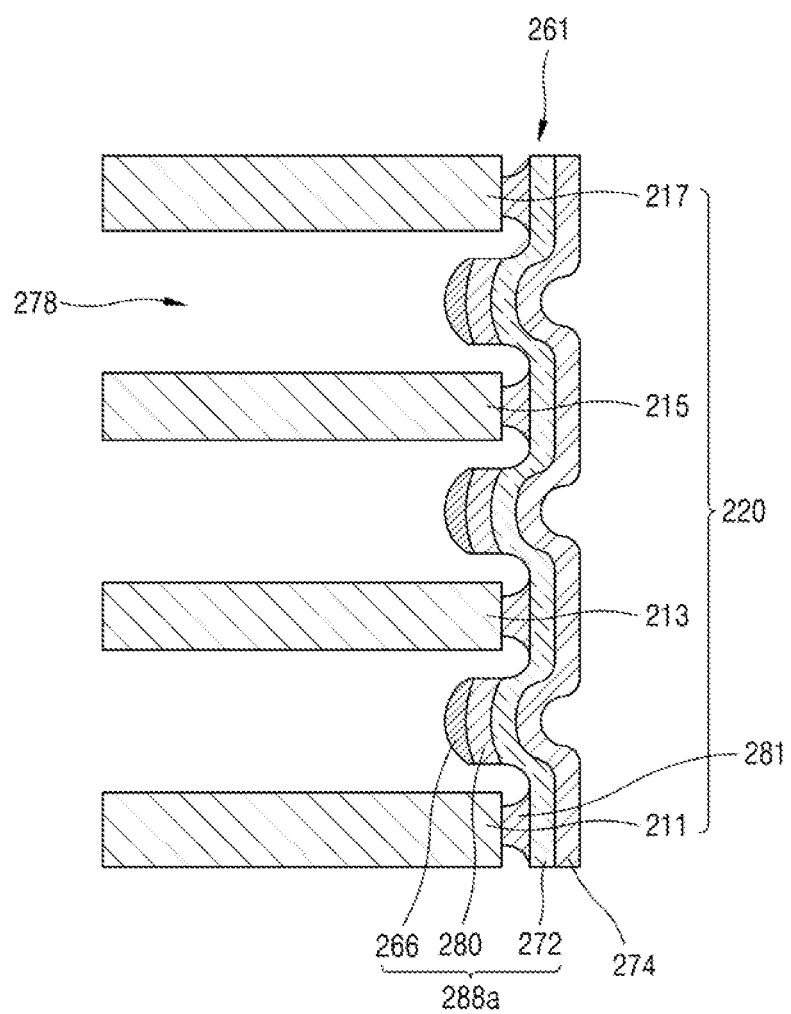

Referring to FIGS. 7G and 7H, as shown in FIG. 7G, the height of the preliminary cavity 276 may be further increased by further etching the side of the interlayer insulating patterns 220 to form the final cavity 278. Hereinafter, the final cavity 278 is referred to as the cavity 278. When the sacrificial patterns 260 of FIG. 7G are etched, the reinforcement layers 292 may also be removed by etching. When the sacrificial patterns 260 of FIG. 7G are etched, the reinforcement layers 292 may be used for protecting the charge storage material layer 270.

Referring to FIG. 7H, the charge storage material layer 270 may be etched by using the first blocking insulating layers 266 as the etching masks to form the charge storage layers 280, as shown in FIG. 6I. Through the cavity 278, the charge storage material layer 270 may be etched by using the first blocking insulating layers 266 as the etching masks. Thus, the charge storage layers 280 may be formed at one side of the first blocking layers 266 and the tunnel insulating layer 272. When the charge storage layers 280 are formed, the dummy charge storage layers 281 may be formed on the sidewall of the interlayer insulating patterns 220. As such, the charge storage layers 280 and the dummy charge storage layers 281 may be separated from each other.

Subsequently, as shown in FIGS. 6J and 6K, the data storage structures 288 including the tunnel insulating layer 272, the charge storage layers 280, and the first and second blocking insulating layers 266 and 284 may be formed at one side of the semiconductor pillar 274. In addition, isolated insulating layers 285 may be formed between the charge storage layers 280 and the dummy charge storage layers 281. The second blocking insulating layers 284 and the isolated insulating layers 285 may include a same material.

Subsequently, as shown in FIGS. 4A and 4B, the gate patterns 320 may be formed in the cavity 278 to complete the vertical non-volatile memory device 10 (see FIGS. 4A and 4B).

Figure 8A:
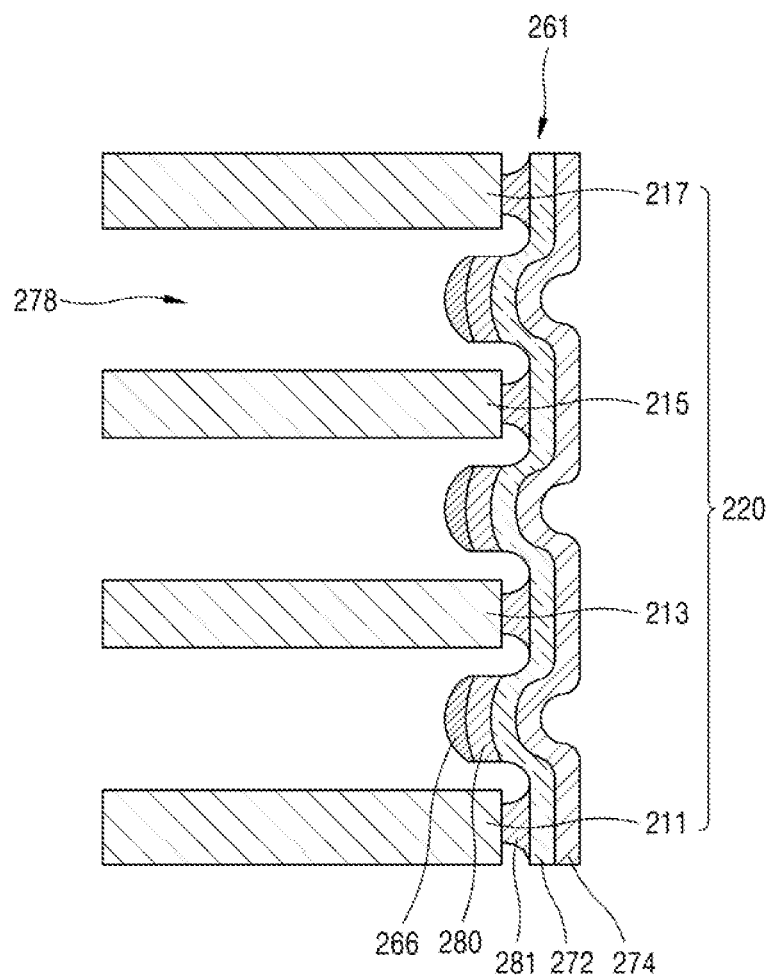
FIGS. 8A and 8B illustrate cross-sectional views for describing a method of manufacturing a vertical non-volatile memory device, according to an example embodiment.
Figure 8B:
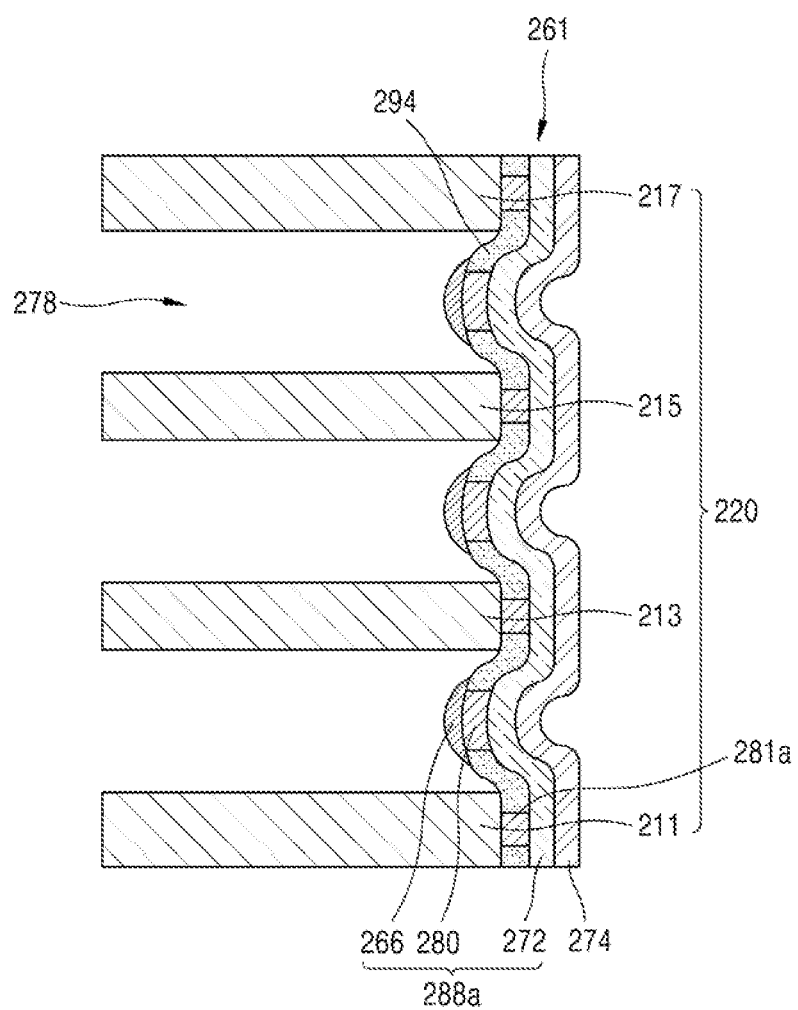

FIGS. 8A and 8B are cross-sectional views for describing a method of manufacturing the vertical non-volatile memory device 10-1 according to an example embodiment.

FIGS. 8A and 8B illustrate stages in a method of manufacturing the vertical non-volatile memory device 10-1 of FIGS. 5A and 5B.

Except for forming isolated insulating layers 294, FIGS. 8A and 8B may be almost identical to FIGS. 7A through 7H and 6A through 6K. In FIGS. 8A and 8B, same members as those of FIGS. 5A and 5B, 6A through 6K and 7A through 7H are marked with same reference numerals, and descriptions set forth above may be briefly restated or omitted.

Referring to FIG. 8B, the manufacturing processes of FIGS. 6A through 6I may be performed. Alternatively, the manufacturing processes of FIGS. 7A through 7H may be performed. The manufacturing process shown in FIG. 8A is described above (see, for example, FIG. 6I and FIG. 7H), and therefore will be omitted.

Referring to FIG. 8B, the charge storage layers 280 and the dummy charge storage layers 281 may be oxidized to form the isolated insulating layers 294. The isolated insulating layers 294 may be formed between the charge storage layers 280 and the dummy charge storage layers 281. In the through hole 261, the charge storage layers 280 may be formed on the sidewall of the interlayer insulating patterns 220 toward the semiconductor pillar 274. Thus, the data storage structures 288a including the tunnel insulating layer 272, the charge storage layers 280, and the first blocking insulating layers 266 may be formed at one side of the semiconductor pillar 274 in the cavity 278.

Subsequently, as shown in FIGS. 5A and 5C, the gate patterns 320 may be formed in the cavity 278 to complete the vertical non-volatile memory device 10-1.

Figure 9A:
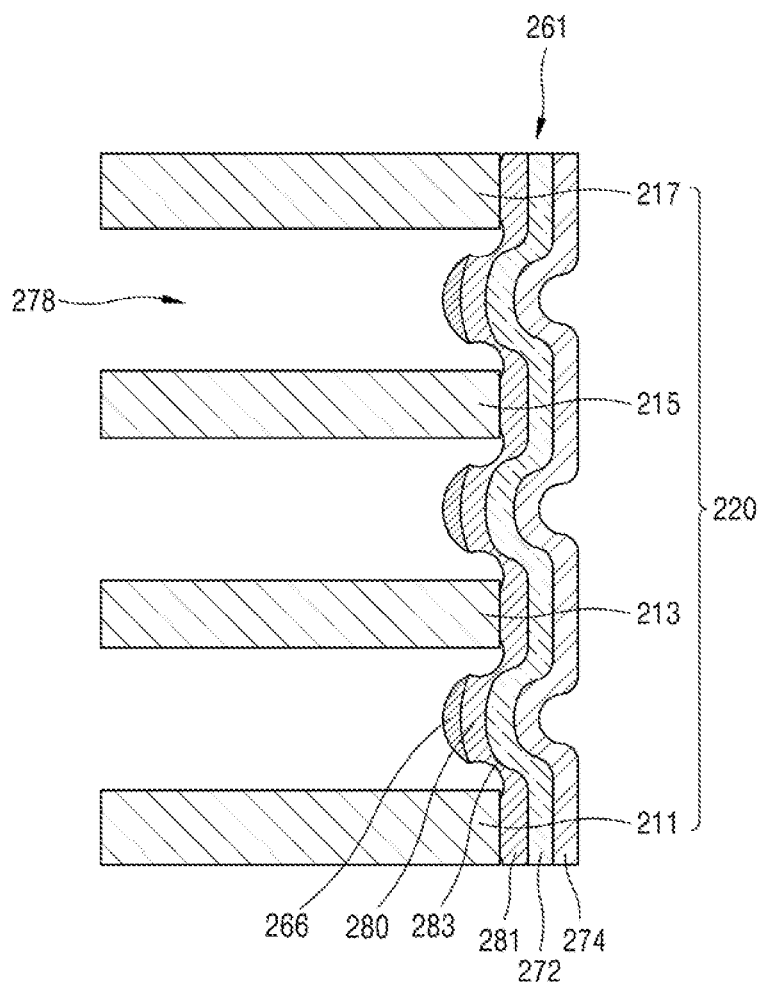
FIGS. 9A and 9B illustrate cross-sectional views for describing a method of manufacturing a vertical non-volatile memory device, according to an example embodiment.
Figure 9B:
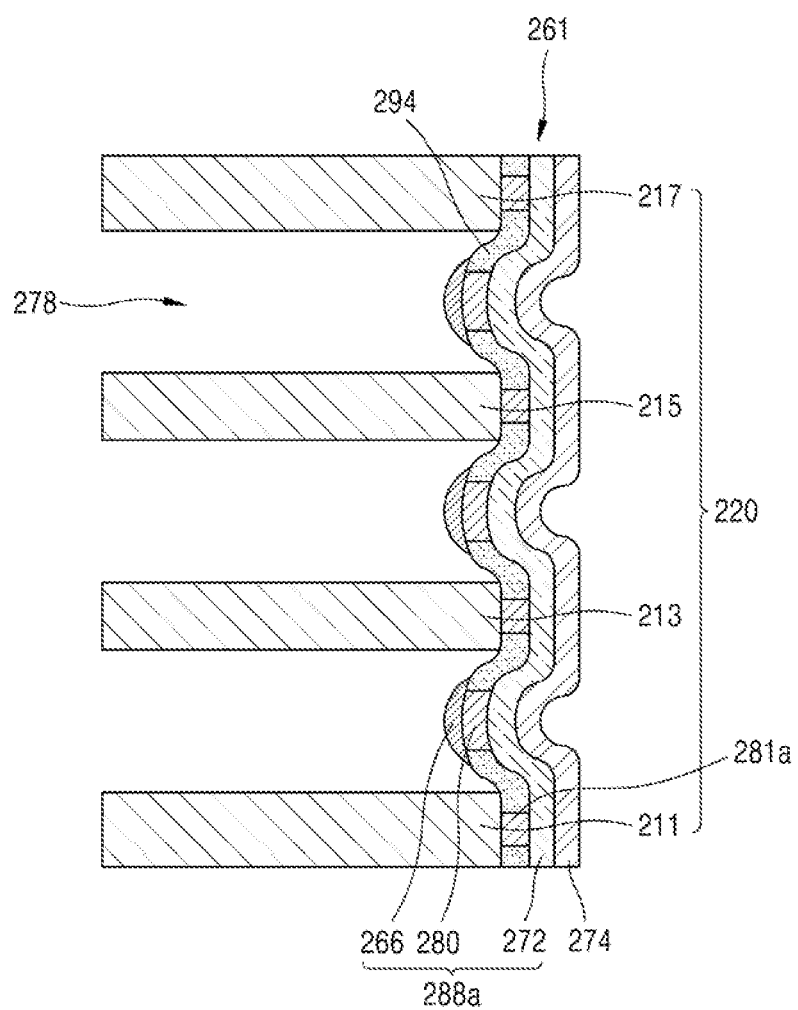

FIGS. 9A and 9B are cross-sectional views illustrating stages in a method of manufacturing the vertical non-volatile memory device 10-1 according to an example embodiment.

FIGS. 9A and 9B are used for describing an embodiment of the method of manufacturing the vertical non-volatile memory device 10-1 of FIG. 5A.

Except a method of forming the isolated insulating layers 294, FIGS. 9A and 9B may be almost identical to FIGS. 7A through 7H and 6A through 6K. In FIGS. 9A and 9B, same members as those of FIGS. 5A and 5B, 6A through 6K, and 7A through 7H are marked with same reference numerals, and descriptions set forth above may be briefly restated or omitted.

Referring to FIG. 9A, the manufacturing processes shown in FIGS. 6A through 6I may be performed. Alternatively, the manufacturing processes of FIGS. 7A through 7H may be performed. When the manufacturing processes shown in FIGS. 6A through 6I or FIGS. 7A through 7H are performed, a portion of the charge storage material layer 283 may remain.

Referring to FIG. 9B, the charge storage material layer 283 may be oxidized to form the isolated insulating layers 294. When the isolated insulating layers 294 are formed, surfaces of the charge storage layers 280 and the dummy charge storage layers 281 may also be oxidized. The isolated insulating layers 294 may be formed between the charge storage layers 280 and the dummy charge storage layers 281.

Thus, the data storage structures 288a including the tunnel insulating layer 272, the charge storage layers 280, and the first blocking insulating layers 266 may be formed at one side of the semiconductor pillar 274 in the cavity. In the through hole 261, the dummy charge storage layers 281 on the sidewall of the interlayer insulating patterns 220 may be formed toward the semiconductor pillar 274.

Subsequently, as shown in FIGS. 5A and 5C, the gate patterns 320 may be formed in the cavity 278 to complete the vertical non-volatile memory device 10.

Figure 10A:
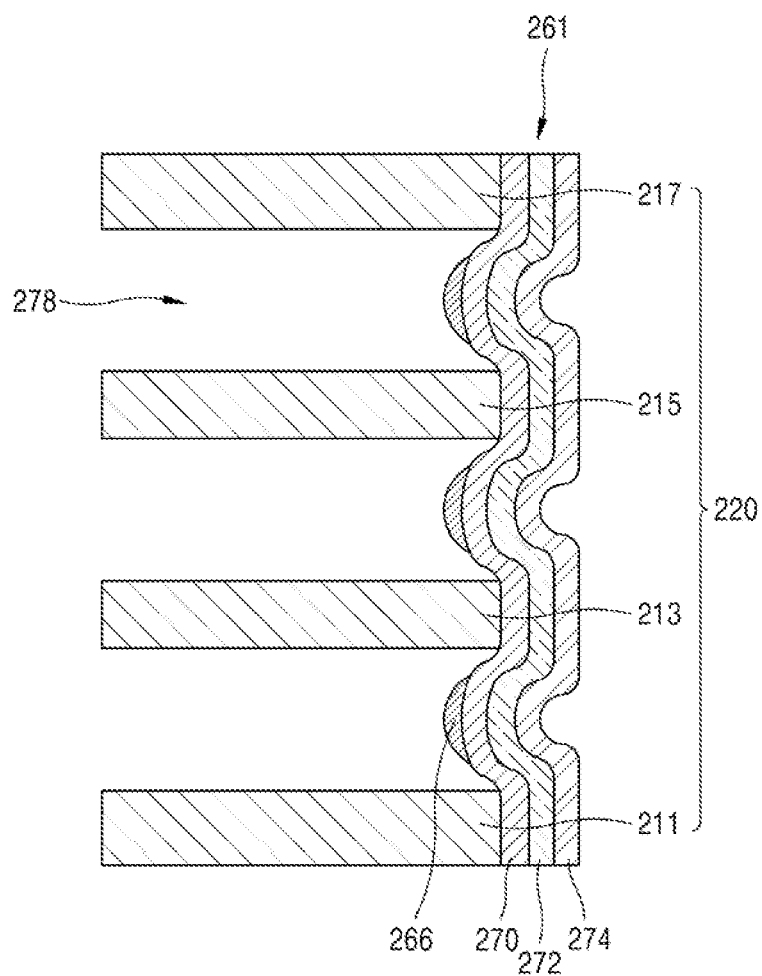
FIGS. 10A and 10B illustrate cross-sectional views for describing a method of manufacturing a vertical non-volatile memory device, according to an example embodiment.
Figure 10B:
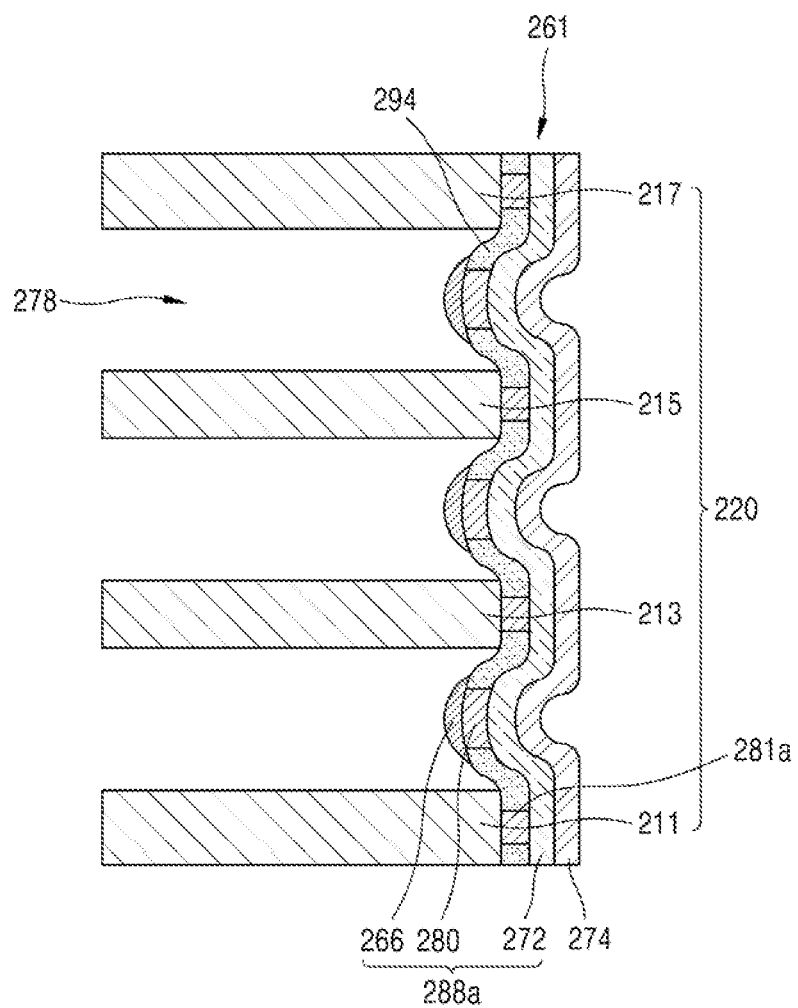

FIGS. 10A and 10B are cross-sectional views illustrating stages in a method of manufacturing the vertical non-volatile memory device 10-1 according to an example embodiment.

FIGS. 10A and 10B are used for describing an embodiment of the method of manufacturing the vertical non-volatile memory device 10-1 shown in FIGS. 5A and 5B.

Except for the method of forming the isolated insulating layers 294, FIGS. 10A and 10B may be almost identical to FIGS. 7A through 7H and 6A through 6K. In FIGS. 10A and 10B, same members as those of FIGS. 5A and 5B, 6A through 6K, and 7A through 7H are marked with same reference numerals, and same descriptions will be briefly given or omitted.

Referring to FIG. 10A, the manufacturing processes shown in FIGS. 6A through 6H may be performed. Alternatively, the manufacturing processes shown in FIGS. 7A through 7G may be performed. Subsequently, the charge storage material layer 270 may be oxidized to form the isolated insulating layers 294. When the isolated insulating layers 294 are formed, the dummy charge storage layers 281 may be formed between the charge storage layers 280 and the dummy charge storage layers 281.

Thus, the data storage structures 288a including the tunnel insulating layer 272, the charge storage layers 280, and the blocking insulating layers 266 may be formed at one side of the semiconductor pillar 274 in the cavity 278. In the through hole 261, the dummy charge storage layers 281 on the sidewall of the interlayer insulating patterns 220 may be formed toward the semiconductor pillar 274.

Subsequently, as shown in FIGS. 5A and 5C, the gate patterns 320 may be formed in the cavity 278 to complete the vertical non-volatile memory device 10-1.

Figure 11:
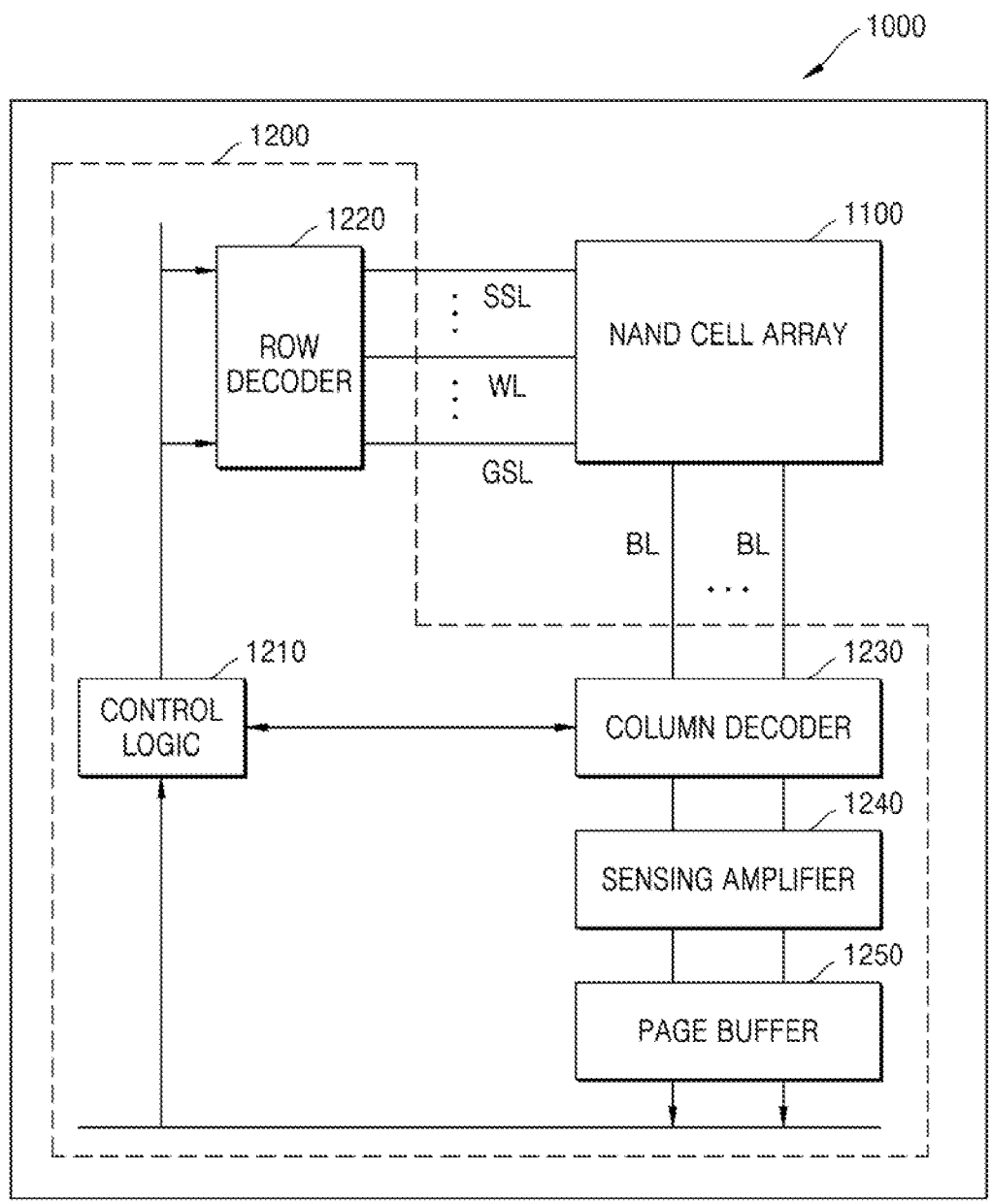
FIG. 11 illustrates a schematic block diagram of a vertical non-volatile memory device according to an example embodiment.

FIG. 11 is a schematic block diagram of a vertical non-volatile memory device 1000 according to an example embodiment.

The vertical non-volatile memory device 1000 may include a NAND cell array 1100 and a core circuit unit 1200. For example, the NAND cell array 1100 may include the vertical non-volatile memory device 1000 described above. The core circuit unit 1200 may include a control logic 1210, a row decoder 1220, a column decoder 1230, a sensing amplifier 1240 and/or a page buffer 1250.

The control logic 1210 may communicate with the row decoder 1220, the column decoder 1230, and/or the page buffer 1250. The row decoder 1220 may communicate with the NAND cell array 1100 having a stack structure through the string selecting lines SSL, the word lines WL, and/or the ground selecting lines GSL. The column decoder 1230 may communicate with the NAND cell array 110 through the bit lines BL. The sensing amplifier 1240 may be connected to the column decoder 1230 when a signal is output from the NAND cell array 1100, and the sensing amplifier 1240 may not be connected to the column decoder 1230 when the signal is transmitted to the NAND cell array 1100.

The control logic 1210 may transmit a row address signal to the row decoder 1220, and the row decoder 1220 may decode the signals and transmit the decoded row address signals to the NAND cell array 1100 through the string selecting lines SSL, the word lines SL, and the ground selecting lines GSL. The control logic 1210 may transmit a column address signal to the column decoder 1230 or the page buffer 1250, and the column decoder 1230 may decode the column address signal and transmit the signal to the NAND cell array 1100 through the bit lines BL. The signal of the NAND cell array 1100 having the stack structure may be transmitted to the sensing amplifier 1240 through the column decoders 273, amplified in the sensing amplifier 1240, and transmitted to the control logic 1210 via the page buffer 1250.

Figure 12:
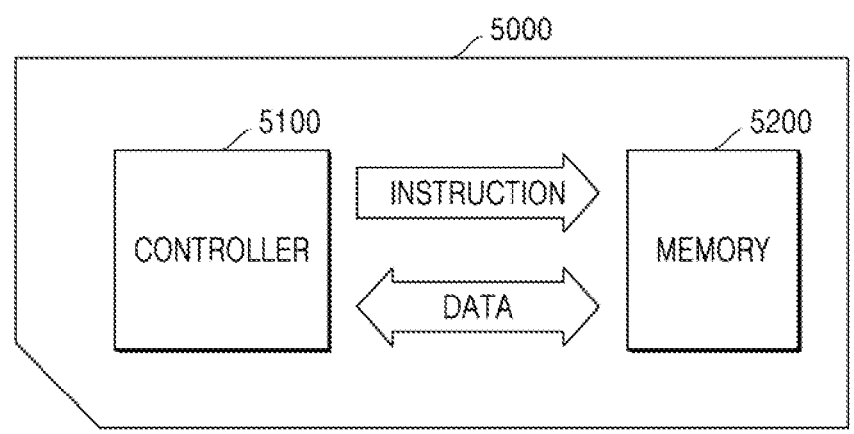
FIG. 12 illustrates a schematic diagram of a card according to an example embodiment.

FIG. 12 is a schematic diagram of a card 5000 according to an example embodiment.

The card 5000 may include a controller 5100 and a memory 5200. The controller 5100 and the memory 5200 may be arranged to exchange electrical signals. For example, when the controller 5100 issues a command, the memory 5200 may transmit data. The memory 5200 may include a vertical non-volatile memory device according to an example embodiment.

A vertical non-volatile memory devices according to various example embodiments may be arranged in "NAND" and "NOR" architecture memory arrays (not shown) to correspond to designs of relevant logic gates. The card 5000 may be used in a memory device such as a memory stick card, a smart media card (SM), a secure digital (SD) card, a mini secure digital (SD) card, a multi media card (MMC), etc.

Figure 13:
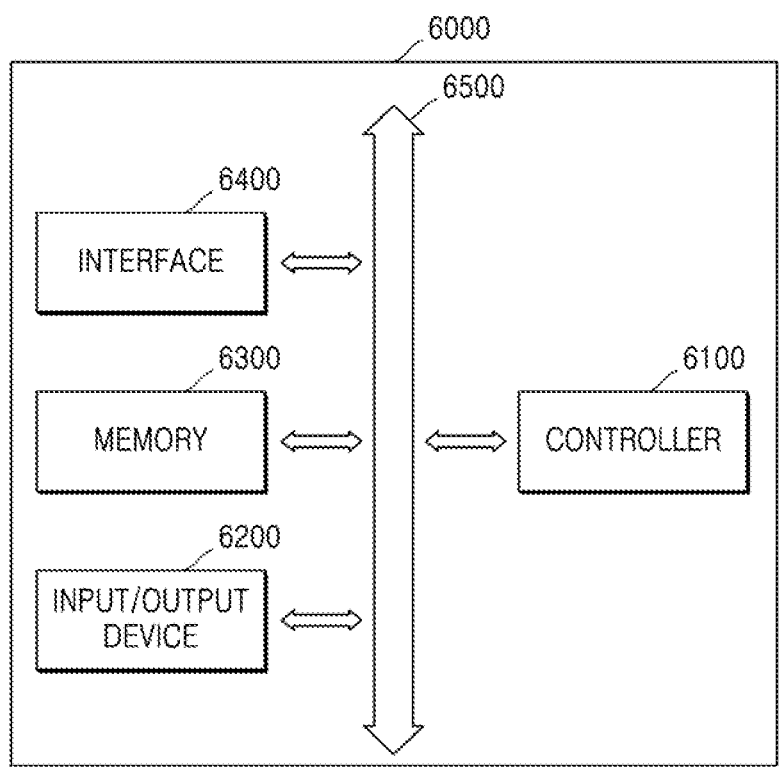
FIG. 13 illustrates a schematic diagram of a system according to an example embodiment.

FIG. 13 is a schematic diagram of a system 6000 according to an example embodiment.

The system 6000 may include a controller 6100, an input/output device 6200, a memory 6300, and an interface 6400. The system 6000 may be a mobile system or a system that transmits or receives data. The mobile system may include a personal digital assistant (PDA), a portable computer, a web tablet, a wireless phone, a mobile phone, a digital music player, a memory card, etc.

The controller 6100 may execute programs and control the system 6000. The controller 6100 may be, for example, a microprocessor, a digital signal processor, a microcontroller, etc. The input/output device 6200 may be used for inputting or outputting data of the system 6000. The system 6000 may be connected to an external device such as a personal computer or a network by using the input/output device 6200 to exchange data with the external device. The input/output device 6000 may be, for example, a keypad, a keyboard, or a display.

The memory 600 may store code and/or data for operation of the controller 610, and/or store the data processed in the controller 6100. The memory 6300 may include a vertical non-volatile memory device according to an example embodiment. The interface 6400 may be a data transmission path between the system 6000 and another external device. The controller 6100, the input/output device 6200, the memory 6300, and the interface 6400 may communicate with one another via the bus 6500.

The system 6000 may be used, for example, for a mobile phone, an MP3 player, a navigation, a portable multimedia player (PMP), a solid state disk (SSD), or household appliances.

By way of summation and review, in a NAND flash memory device, one cell may include one transistor, and cell transistors may be vertically stacked to improve integration. When cell transistors included in the non-volatile memory device are stacked in the vertical direction, charge storage characteristics of each cell transistor located in the vertical direction are important.

As described above, embodiments may provide a vertical non-volatile memory device in which charge storage characteristics of each cell transistor located in a vertical direction may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A vertical non-volatile memory device, comprising:
   a stack body including gate patterns and interlayer insulating patterns stacked in a stacking direction, the stack body having a through hole, which extends in the stacking direction, in the gate patterns and in the interlayer insulating patterns;
   a semiconductor pillar in the through hole and extending in the stacking direction;
   data storage structures between the gate patterns and the semiconductor pillar in the through hole, the data storage structures including charge storage layers; and
   dummy charge storage layers on a sidewall of the interlayer insulating patterns toward the semiconductor pillar in the through hole, the dummy charge storage layers being formed of a same charge storage material as the charge storage layers.

2. The vertical non-volatile memory device as claimed in claim 1, wherein the charge storage layers and the dummy charge storage layers have a discontinuous structure, in which the charge storage layers and the dummy charge storage layers do not extend in the stacking direction in the through hole.

3. The vertical non-volatile memory device as claimed in claim 1, further comprising isolated insulating layers in contact with the charge storage layers in the through hole, wherein the charge storage layers are separated from the dummy charge storage layers by the isolated insulating layers.

4. The vertical non-volatile memory device as claimed in claim 1, wherein the charge storage layers are partially on a sidewall of the gate patterns, and the dummy charge storage layers are partially on a sidewall of the interlayer insulating patterns.

5. The vertical non-volatile memory device as claimed in claim 1, wherein the data storage structures include a tunnel insulating layer, the charge storage layers, and blocking insulating layers sequentially formed in a direction of the gate patterns on the semiconductor pillar.

6. The vertical non-volatile memory device as claimed in claim 5, wherein the blocking insulating layers include a single insulating layer or a plurality of insulating layers.

7. The vertical non-volatile memory device as claimed in claim 5, wherein the blocking insulating layers are entirely or partially on a sidewall of the gate patterns.

8. The vertical non-volatile memory device as claimed in claim 5, wherein the blocking insulating layers have a discontinuous structure in which the blocking insulating layers do not extend in the stacking direction in the through hole.

9. The vertical non-volatile memory device as claimed in claim 5, wherein the tunnel insulating layer has a discontinuous structure in which the tunnel insulating layer extends in the stacking direction in the through hole.

10. The vertical non-volatile memory device as claimed in claim 1, wherein the charge storage layers and the dummy charge storage layers are on different lines in the stacking direction in the through hole.

11. A vertical non-volatile memory device, comprising:
a stack body including gate patterns and interlayer insulating patterns that are alternately stacked in a stacking direction, the stack body having a through hole extending in the stacking direction in the gate patterns and the interlayer insulating patterns, the stack body including recess holes communicating with the through hole and recessed from a sidewall of the interlayer insulating patterns in a direction of the gate patterns;
data storage structures including blocking insulating layers in contact with the gate patterns in the recess holes, charge storage layers in contact with the blocking insulating layers in the recess holes, and a tunnel insulating layer in contact with the charge storage layers and extending in the stacking direction in the through hole;
a semiconductor pillar in contact with the data storage structures and extending in the stacking direction in the through hole and the recess holes;
dummy charge storage layers on a sidewall of the interlayer insulating patterns toward the semiconductor pillar in the through hole; and
isolated insulating layers arranged in the stacking direction and in contact with the charge storage layers in the recess holes and the through hole, wherein the charge storage layers are separated from the dummy charge storage layers by the isolated insulating layers.

12. The vertical non-volatile memory device as claimed in claim 11, wherein the blocking insulating layers are entirely in contact with the gate patterns in the recess holes.

13. The vertical non-volatile memory device as claimed in claim 11, wherein the blocking insulating layers are partially in contact with the gate patterns in the recess holes.

14. The vertical non-volatile memory device as claimed in claim 11, wherein:
surfaces of the recess holes that contact the gate patterns are curved, and
surfaces of the data storage structures that contact the curved surfaces of the recess holes are curved.

15. A vertical non-volatile memory device, comprising:
a stack body including gate patterns and interlayer insulating patterns that are alternately stacked, the stack body having a through hole extending in a stacking direction in the gate patterns and the interlayer insulating patterns, the stack body including curved-surface recess holes that are recessed from a sidewall of the interlayer insulating patterns in a direction of the gate patterns, the curved-surface recess holes communicating with the through hole and having a curved surface;
curved-surface data storage structures in the curved-surface recess holes, the curved-surface data storage structures including curved-surface blocking insulating layers in contact with the gate patterns, curved-surface charge storage layers in contact with the curved-surface blocking insulating layers, and a curved-surface tunnel insulating layer in contact with the curved-surface charge storage layers in the curved-type recess holes and extending in the stacking direction in the through hole;
isolated insulating layers in the stacking direction in the curved-surface recess holes and the through hole to contact the curved-surface charge storage layers;
dummy charge storage layers on the sidewall of the interlayer insulating patterns in the through hole and the curved-surface recess holes, the dummy charge storage layers being separated by the isolated insulating layers; and
a curved-surface semiconductor pillar being on a sidewall of the curved-surface tunnel insulating layer and a side of the dummy charge storage layers and extending in the stacking direction in the through hole.

16. The vertical non-volatile memory device as claimed in claim 15, wherein the isolated insulating layers are on the sidewall of the interlayer insulating patterns and under the interlayer insulating patterns.

17. The vertical non-volatile memory device as claimed in claim 15, wherein the dummy charge storage layers, the isolated insulating layers, and the curved-surface charge storage layers are connected to one another in the stacking direction in the recess holes and the through hole.

18. The vertical non-volatile memory device as claimed in claim 15, wherein:
the curved-surface blocking insulating layers are entirely in contact with the gate patterns in the curved-surface recess holes, and
the curved-surface blocking insulating layers include first insulating layers on a sidewall of the curved-surface charge storage layers and second insulating layers located on a sidewall of the first insulating layers and being in contact with the gate patterns.

19. The vertical non-volatile memory device as claimed in claim 16, wherein:
the curved-surface blocking insulating layers are partially in contact with the gate patterns in the curved-surface recess holes, and
the curved-surface blocking insulating layers include insulating layers on a sidewall of the curved-surface charge storage layers.

* * * * *